(12) United States Patent
Pain

(10) Patent No.: US 7,749,799 B2
(45) Date of Patent: Jul. 6, 2010

(54) BACK-ILLUMINATED IMAGER AND METHOD FOR MAKING ELECTRICAL AND OPTICAL CONNECTIONS TO SAME

(75) Inventor: Bedabrata Pain, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 637 days.

(21) Appl. No.: 11/600,583

(22) Filed: Nov. 15, 2006

(65) Prior Publication Data

US 2007/0117254 A1  May 24, 2007

Related U.S. Application Data

(60) Provisional application No. 60/736,675, filed on Nov. 15, 2005, provisional application No. 60/854,620, filed on Oct. 26, 2006.

(51) Int. Cl.
   *H01L 21/00*  (2006.01)
(52) U.S. Cl. .......................... 438/75; 257/432
(58) Field of Classification Search .................. 438/60, 438/65–70
   See application file for complete search history.

(56) References Cited

U.S. PATENT DOCUMENTS

| | | |
|---|---|---|
| 4,422,091 A | 12/1983 | Liu |
| 4,656,519 A | 4/1987 | Savoye |
| 4,774,557 A | 9/1988 | Kosonocky |
| 5,122,669 A | 6/1992 | Herring et al. |
| 5,134,274 A | 7/1992 | Poole et al. |
| 5,227,313 A | 7/1993 | Gluck et al. |
| 5,244,817 A | 9/1993 | Hawkins et al. |
| 5,424,574 A | 6/1995 | Morgante |
| 5,688,715 A | 11/1997 | Sexton et al. |
| 5,907,767 A | 5/1999 | Tohyama |
| 5,940,685 A | 8/1999 | Loomis et al. |
| 6,040,591 A | 3/2000 | Otsuka |
| 6,168,965 B1 | 1/2001 | Malinovich et al. |
| 6,169,319 B1 | 1/2001 | Malinovich et al. |
| 6,204,506 B1 | 3/2001 | Akahori et al. |
| 6,242,730 B1 | 6/2001 | Lin et al. |
| 6,259,085 B1 | 7/2001 | Holland |
| 6,429,036 B1 | 8/2002 | Nixon et al. |
| 6,498,073 B2 | 12/2002 | Sarma et al. |

(Continued)

FOREIGN PATENT DOCUMENTS

DE   198 38 373 A1   3/2000

(Continued)

*Primary Examiner*—Ha Tran T Nguyen
*Assistant Examiner*—Valerie Brown
(74) *Attorney, Agent, or Firm*—Steinfl & Bruno

(57) ABSTRACT

Methods for bringing or exposing metal pads or traces to the backside of a backside-illuminated imager allow the pads or traces to reside on the illumination side for electrical connection. These methods provide a solution to a key packaging problem for backside thinned imagers. The methods also provide alignment marks for integrating color filters and microlenses to the imager pixels residing on the frontside of the wafer, enabling high performance multispectral and high sensitivity imagers, including those with extremely small pixel pitch. In addition, the methods incorporate a passivation layer for protection of devices against external contamination, and allow interface trap density reduction via thermal annealing. Backside-illuminated imagers with illumination side electrical connections are also disclosed.

19 Claims, 37 Drawing Sheets

U.S. PATENT DOCUMENTS

| | | |
|---|---|---|
| 6,498,336 B1 | 12/2002 | Tian et al. |
| 6,809,008 B1 | 10/2004 | Holm et al. |
| 6,927,432 B2 | 8/2005 | Holm et al. |
| 2001/0019164 A1 | 9/2001 | Yin |
| 2001/0026001 A1 | 10/2001 | Yagi |
| 2001/0054723 A1 | 12/2001 | Narui |
| 2002/0084474 A1 | 7/2002 | Sarma et al. |
| 2003/0025160 A1 | 2/2003 | Suzuki et al. |
| 2003/0038289 A1 | 2/2003 | Yamazaki et al. |
| 2003/0214595 A1 | 11/2003 | Mabuchi |
| 2003/0222204 A1 | 12/2003 | Gidon et al. |
| 2005/0074954 A1 | 4/2005 | Yamanaka |
| 2005/0104148 A1 * | 5/2005 | Yamamoto et al. .......... 257/432 |

FOREIGN PATENT DOCUMENTS

| | | |
|---|---|---|
| FR | 2 863 773 A1 | 6/2005 |
| JP | 2004/134672 | 4/2004 |
| WO | 2004/054001 | 6/2004 |

* cited by examiner

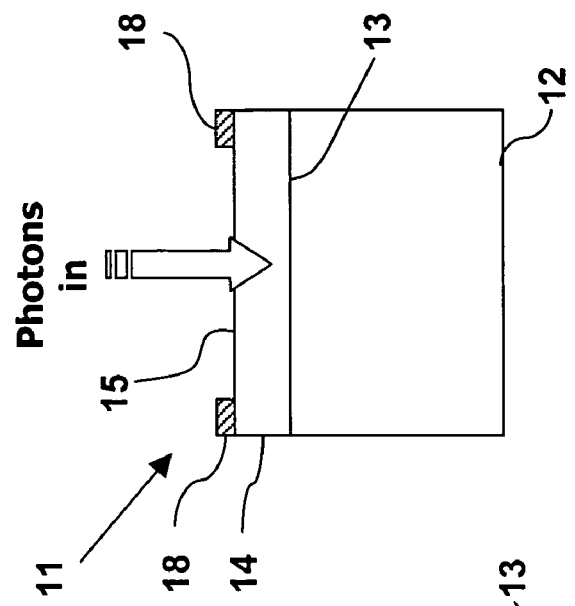
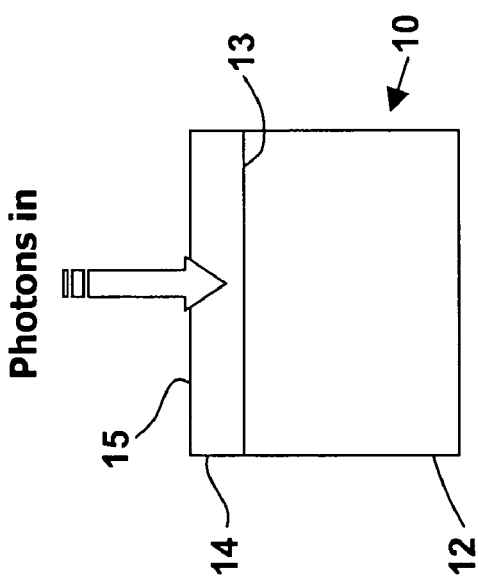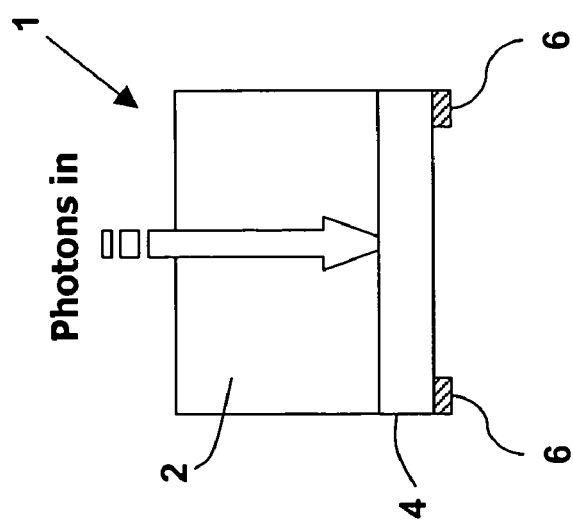

BACK-ILLUMINATED IMAGER AND METHOD FOR MAKING ELECTRICAL AND OPTICAL CONNECTIONS TO SAME

CROSS REFERENCE TO RELATED APPLICATION

This application claims the benefit of U.S. provisional patent application Ser. No. 60/736,675, filed Nov. 15, 2005 for a "Method for Making Electrical and Optical Connections to a Back Illuminated Imager" by Bedabrata Pain, and U.S. provisional patent application Ser. No. 60/854,620, filed Oct. 26, 2006 for "Packaging Techniques for back-illuminated Imagers" by Bedabrata Pain, the disclosures of both of which applications are incorporated herein by reference for all purposes permitted by law and regulation. This application is also related to U.S. application Ser. No. 11/226,902 of Bedabrata Pain for "Method for Implementation of Back-Illuminated CMOS or CCD Imagers," and U.S. application Ser. No. 11/226,903 of Bedabrata Pain and Thomas J. Cunningham for "Structure for Implementation of Back-Illuminated CMOS or CCD Imagers," the disclosures of which are incorporated herein by reference for all purposes permitted by law and regulation.

STATEMENT REGARDING FEDERALLY SPONSORED RESEARCH OR DEVELOPMENT

Subject matter disclosed in this specification was supported at least in part through the performance of work under a NASA contract, and is subject to the provisions of Public Law 96-517 (35 U.S.C. §202) in which the Contractor has elected to retain title.

FIELD

The present disclosure relates to light-responsive solid-state devices and in particular imagers. In particular, it relates to backside-illuminated imagers and means for packaging the same.

BACKGROUND

A silicon microchip made in a very large scale integrated (VLSI) process traditionally has a substrate (typically made of silicon) on which the electronic devices such as transistors and diodes sit or are embedded, and has its metal pads brought out to the frontside. By "frontside" is meant the side on which the electronic devices are formed by processes such as masking, sputtering, ion implantation, etching, and the like. The "backside" is the opposed side of the silicon microchip or imager.

Imagers made by a VLSI process that receive their illumination on the frontside are known, but have limitations such as poor collection efficiency, low sensitivity, low quantum efficiency (QE), increased cross-talk, and poor angular response. Backside thinned and backside-illuminated imagers have advantages that are known, such as a higher quantum efficiency and excellent angular response.

Backside thinned and back-illuminated imagers have been built such as the conventional imager 1 shown in FIG. 1 in the drawings. By "backside-thinned" is meant the result of the process of removing material at the backside of the silicon microchip or imager. "Backside-illuminated" means that the backside of the silicon microchip or imager is exposed to light rather than the frontside. In the known structure shown in FIG. 1, a transparent substrate 2 is bonded to the silicon 4 for providing mechanical support, while the metal pads 6 are brought out on the frontside in the traditional format or packaging solution.

A drawback of known backside-thinned and backside-illuminated imagers, such as the imager 1 shown in FIG. 1, is that light has to pass through the thick transparent substrate 2 before reaching the silicon 4, resulting in a loss of angular response. It is also difficult to integrate color filters and microlenses on the substrate. A secondary drawback is that light comes from the side opposite to where the metal pads sit. This is not compatible with wire-bonding based packaging solutions.

For implementation of backside thinned and backside-illuminated color imagers with high sensitivity (possibly requiring the use of microlens arrays) and good angular response, the transparent substrate layer on the back of the silicon needs to be eliminated, so that light is coupled to the exposed silicon surface without having to pass through an interposing layer, and color filters, anti-reflection coatings, and microlenses can be deposited in the immediate proximity of the exposed silicon surface.

Another difficulty pertains to the location of metal pads. Elimination of the interposing transparent substrate layer on the silicon backside (that is, the illumination side) requires a bonded base on the traditional frontside of the silicon wafer in order to provide mechanical support to the imager. Thus, the metal pads for electrical connection to the imager devices must be brought out through the illumination side (or the traditional backside of the wafer)—which is the top side of the structure.

An additional difficulty with respect of bringing the pads through the backside is to ensure that each metal connection is electrically isolated from each-other and from the silicon wafer through which it passes from the front to the backside.

Yet another difficulty pertains to the alignment of a color filter/microlens array on the backside. Backside-illuminated imagers are usually implemented for monochrome imaging because of difficulties in aligning color filter and microlens (CF/ML) arrays on the backside of the silicon of the imager. The problem stems from the fact that a traditional VLSI method builds devices "up" on the silicon frontside. Thus, neither devices nor alignment features are present in the backside (the illumination side) for accurately aligning the CF/ML arrays, preventing a color imager implementation.

A further difficulty is to make sure that the resultant structure after the pads are brought out to the backside can be heated to higher temperatures (below the melting point of metal) without any material degradation due to outgassing, deformation, softening, or delamination.

SUMMARY

The present disclosure provides methods for making backside-illuminated imagers that solve packaging-related problems. The present disclosure also provides methods for making backside-illuminated imagers with integrated color filters and microlenses. The present disclosure provides novel backside-illuminated imagers and in particular backside-illuminated imagers with integrated color filters and microlenses.

An aspect of the present disclosure provides a method for bringing electrical connections from frontside metal to the backside of an imager for connection to backside metal pads. Alternatively, a method may be provided for exposing internal communication conductors on the backside for providing I-O pads accessible to the backside.

The provision of alignment keys, features or marks for aligning backside deposited microlens and color-filter array layers may be included as a step in the method. This will permit optical connections to be properly established between the pixel elements in the imager and superimposed optical components.

In an aspect of the methods disclosed herein, a method of fabricating a back-illuminated imaging structure is provided, comprising the steps of providing a wafer having a frontside and a backside; forming a device layer including one or more imager structures on the frontside of the wafer; forming a metal and dielectric stack on the device layer; providing electrical access from the backside of the wafer to the metal and dielectric stack; and providing one or more first alignment marks or features on the frontside of the wafer.

In another aspect of the methods disclosed herein, a method of fabricating a backside-illuminated imaging structure is provided, comprising the steps of providing a wafer; forming a device layer on a frontside of the wafer; creating a cavity extending between the frontside and a backside of the wafer; lining the cavity with a dielectric material; filling the lined cavity with a conductive material; adding a conductive trace on the frontside of the wafer in order to electrically connect the device layer to the conductive material in the cavity; and forming one or more pads of conductive material on the backside of the wafer, at least one of the pads being in electrical connection to the conductive material in the cavity.

In yet another aspect of the methods disclosed herein, a method of fabricating a backside-illuminated imaging structure is provided, comprising the steps of providing a wafer; forming a device layer on the frontside of the wafer; creating a first cavity extending between a frontside and a backside of the wafer; filling the cavity with a dielectric filler material; adding a conductive trace on the frontside of the wafer in order to electrically connect the device layer to the dielectric filler material in the cavity; creating a second cavity in the dielectric filler material; filling the second cavity with a conductive material; and forming one or more pads of conductive material on the backside of the wafer, at least one of the pads being in electrical connection to the conductive material in the cavity.

In still another aspect of the methods disclosed herein, a method of fabricating a backside-illuminated imaging structure is provided, comprising the steps of providing a wafer having a frontside and a backside; forming a device layer including one or more imager structures on the frontside of the wafer; forming a metal and dielectric stack on the device layer and having at least one metal trace; and forming a cavity in the wafer between the backside and the at least one metal trace.

In an aspect of the structures disclosed herein, a backside-illuminated imaging structure is provided, comprising a wafer having a frontside and a backside; a device layer including one or more imager structures formed on the frontside of the wafer; a via extending between the frontside and the backside, the via having a dielectric lining; conductive material in or on the frontside to electrically connect one or more devices to the via; and a first pad of conductive material adjacent the backside and in electrical connection to the via.

In another aspect of the structures disclosed herein, a backside-illuminated imaging structure is provided, comprising a wafer having a frontside and a backside; a device layer including one or more imager structures formed on the frontside of the wafer; a metal and dielectric stack formed on the device layer and having at least one metal trace; a cavity formed in the wafer between the backside and the at least one metal trace.

BRIEF DESCRIPTION OF THE DRAWINGS

The present invention will be understood and appreciated more fully from the following detailed description taken in conjunction with the drawings. The accompanying drawings, which constitute part of this specification, help to illustrate embodiments of the disclosure. In the drawings, like numerals are used to indicate like elements throughout.

FIG. 1 is a schematic cross-sectional view of a backside-illuminated imager structure having a backside-mounted transparent substrate.

FIG. 2 is a schematic cross-sectional view of a back-illuminated imager having a frontside-mounted substrate.

FIG. 3 is a schematic cross-sectional view of a preferred embodiment according to the present disclosure of a backside-illuminated imager having a frontside-mounted substrate and having backside input-output (I-O) pads in a standard packaging format.

DETAILED DESCRIPTION OF PREFERRED EMBODIMENTS

Figure 4:
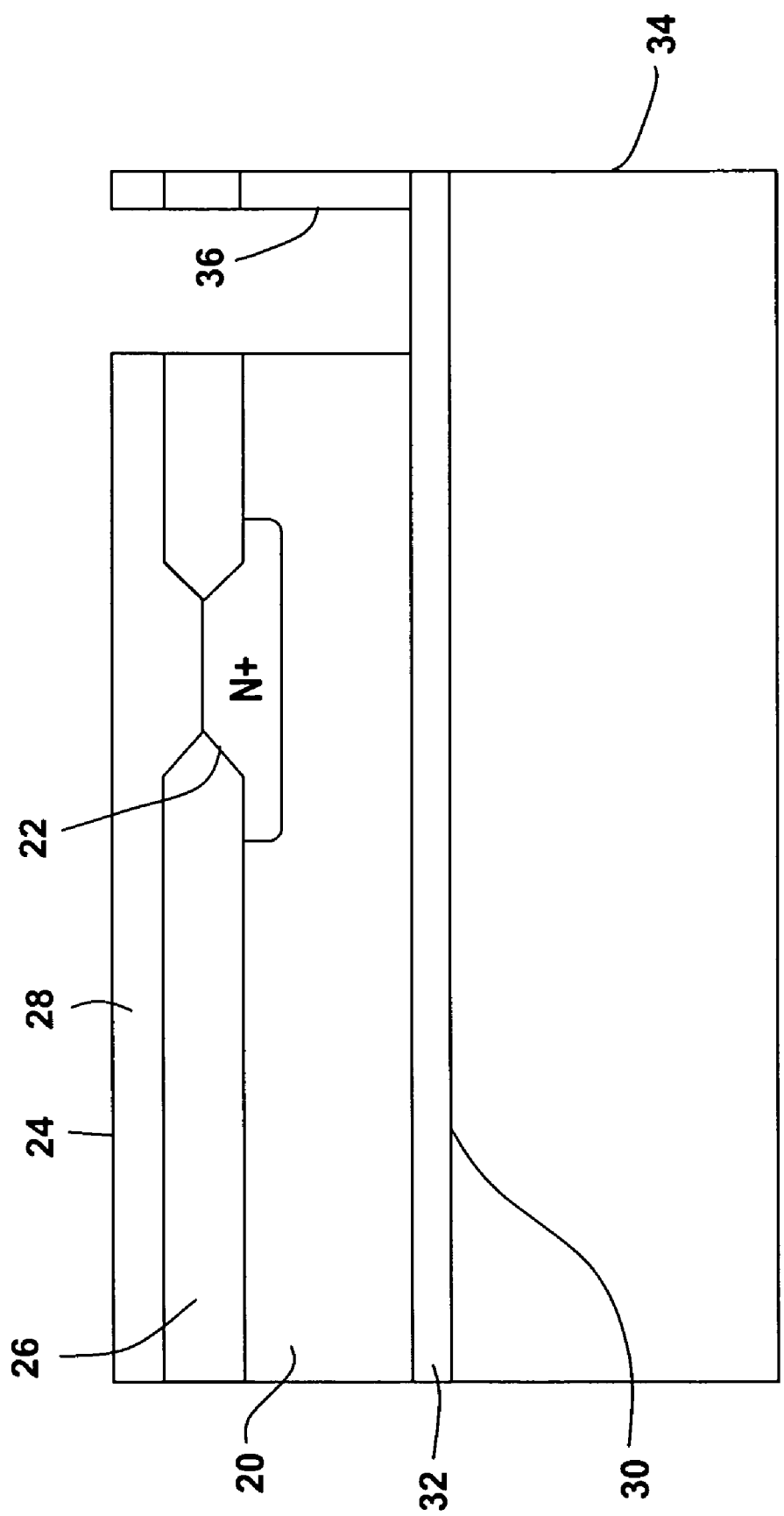
FIGS. 4-14 show schematic cross-sectional views of a backside-illuminated imager having standard packaging at successive steps of its preparation according to a first preferred method for preparing backside-illuminated imagers.

For the purposes of this specification, unless otherwise indicated, all numbers expressing quantities of ingredients, reaction conditions, and so forth used in the specification are to be understood as being modified in all instances by the term "about." Accordingly, unless indicated to the contrary, the numerical parameters set forth in the following specification are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub ranges subsumed therein, and every number between the end points. Additionally, any reference referred to as being "incorporated herein" is to be understood as being incorporated in its entirety.

It is further noted that, as used in this specification, the singular forms "a," "an," and "the" include plural referents unless expressly and unequivocally limited to one referent.

FIG. 2 shows the schematic cross-section of a backside-illuminated complementary metal-oxide-semiconductor (CMOS)/charge-coupled device (CCD) imager 10 according to the disclosure herein. The imager 10 rests on a frontside-mounted glass or organic substrate 12 that provides the necessary mechanical support. The silicon layer 14 preferably comprises a passivated silicon layer for light collection adjacent the backside 15. On the frontside 13 of the silicon layer 14, opposite the backside 15, structures such as the p-n junctions, transfer gates, and metal oxide semiconductor field effect transistors (MOSFETs) (not shown in FIG. 2) may be fabricated as desirable. Inter-level dielectrics (ILD) and multiple metal layers for circuit interconnection (not shown in FIG. 2) may be provided underneath (above, as seen in FIG. 2) or alongside the p-n junctions, transfer gates, and MOSFETs. The p-n junctions, transfer gates, MOSFETs, ILDs, and multiple metal layers for circuit interconnection may be provided in arrangements known to those of skill in the art. The term "device layer" will refer to the p-n junctions, transfer gates, MOSFETs, ILDs, and multiple metal layers for circuit interconnection.

FIG. 3 shows the schematic cross-section of a backside-illuminated CMOS/CCD imager 11 having a standard packaging according to the disclosure herein. It consists of a passivated silicon layer 14 for light collection. P-n junctions, transfer gates, and/or MOSFETs (not shown in FIG. 3) are fabricated on the frontside surface 13 of the silicon layer 14 opposite to its light-collection backside surface 15. Underneath the surface 13 of the silicon layer 14 reside the ILDs and multiple metal layers for circuit interconnection (also not shown in FIG. 3). The imager 11 has backside mounted I-O pads 18, preferably made of a metal. Providing frontside mounted I-O pads is a standard packaging format for a frontside-illuminated imager. The imager 11 is a backside-illuminated imager and has backside mounted I-O pads, so that it conforms to the standard packaging format.

Preferred methods are now disclosed for creating backside-illuminated imagers with backside mounted I-O pads in a standard packaging format. Generally, the first and second preferred methods, corresponding to FIGS. 4-14 and FIGS. 15-24 in the drawings, respectively, electrically connect any of the electronics and metal layers of the imager wafer to the backside before the substrate or support wafer is attached to the frontside. The third and fourth preferred methods, corresponding to FIGS. 25-32 and FIGS. 33-39 of the drawings, respectively, provide electrical access from the backside to the electronics and metal layers after the substrate or support wafer is attached to the frontside.

A first preferred process for making a backside-illuminated imager with standard packaging will now be described in reference to FIGS. 4-14 in the drawings. FIGS. 4-14 show steps of this process used for making backside mounted I-O pads followed by the mounting or addition of CF/ML arrays.

The first preferred process for making a backside-illuminated imager with standard packaging begins with a wafer 20 containing the electronics and imaging devices attached to a handle wafer 34. This is an "SOI" configuration: it consists of a silicon layer 20 (S), a buried oxide 32, and a handle silicon wafer 34. The wafer 20 and handle wafer 34 may be formed as disclosed in my related application Ser. No. 11/226,902, the disclosure of which has been incorporated by reference in its entirety and especially is referred to in this portion of the specification for its disclosure in connection with its FIGS. 8-12.

FIG. 4 of the present disclosure shows the wafer 20 joined to the handle wafer 34. Although only a portion of each of the wafer 20 and the handle wafer 34 are shown in the drawings, the fabrication is carried on the entire wafer 20.

The wafer 20 preferably is made of silicon. Other semiconductor materials may be used, such as silicon-germanium, as will be known to those of skill in the art. The frontside electronics 22 (here, an N+ well) are formed on and/or below the frontside 24 of the wafer 20 using processes such as CMOS technology, wherein the electronics 22 may be built up and/or implanted in the silicon wafer 20. It will be understood that the one N+ well shown in FIG. 4 is exemplary and that many wells could be provided as part of the electronics 22. The frontside 24 of the wafer 20 may include a isolation oxide (alternately termed field oxide or shallow trench isolation) layer 26 comprised of a mixture of thermally grown or deposited silicon dioxide and an additionally deposited silicon oxide layer 28. The backside 30 of the wafer 20 is provided with a buried oxide layer 32.

The additional steps shown in FIGS. 4-14 will provide an electrical connection between the frontside electronics and a pad on the backside of the wafer. FIG. 4 shows the result of an initial step of the process, namely the etching of a cavity or a via hole 36 at a selected location in the wafer by using available reactive-ion etching (RIE) techniques. The cavity or via hole 36 serve as a first alignment mark or feature that ultimately can permit the positioning of color filter and microlens arrays on the backside of the wafer above the imager structures in the wafer.

Using the buried oxide layer 32 as an etch-stop, the etched cavity 36 will extend up to the bottom surface of the buried oxide layer.

Figure 5:
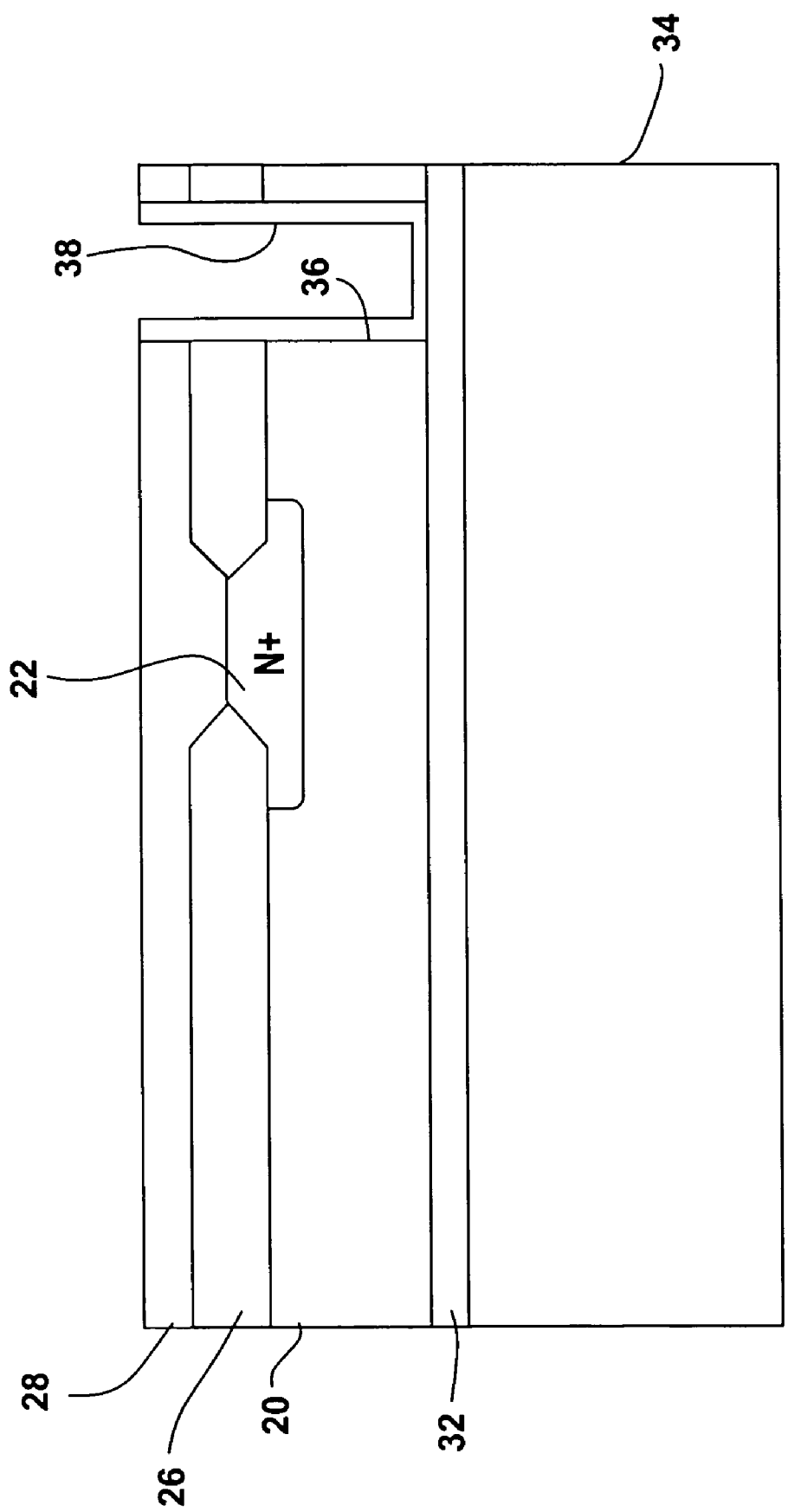

The result of the next step is shown in FIG. 5. A liner oxide 38 is deposited on the walls and the bottom of the cavity 36 through available low-temperature silicon dioxide deposition methods such as plasma-enhanced chemical vapor deposition (PECVD). The thickness of the liner oxide may be 0.3 micron. The deposition temperature will be kept below 350 C. in order to protect the frontside metal (e.g. aluminum) from melting and flowing. The liner oxide 38 provides the necessary electrical isolation of one cavity from another, as well as from the adjacent silicon.

Figure 6:
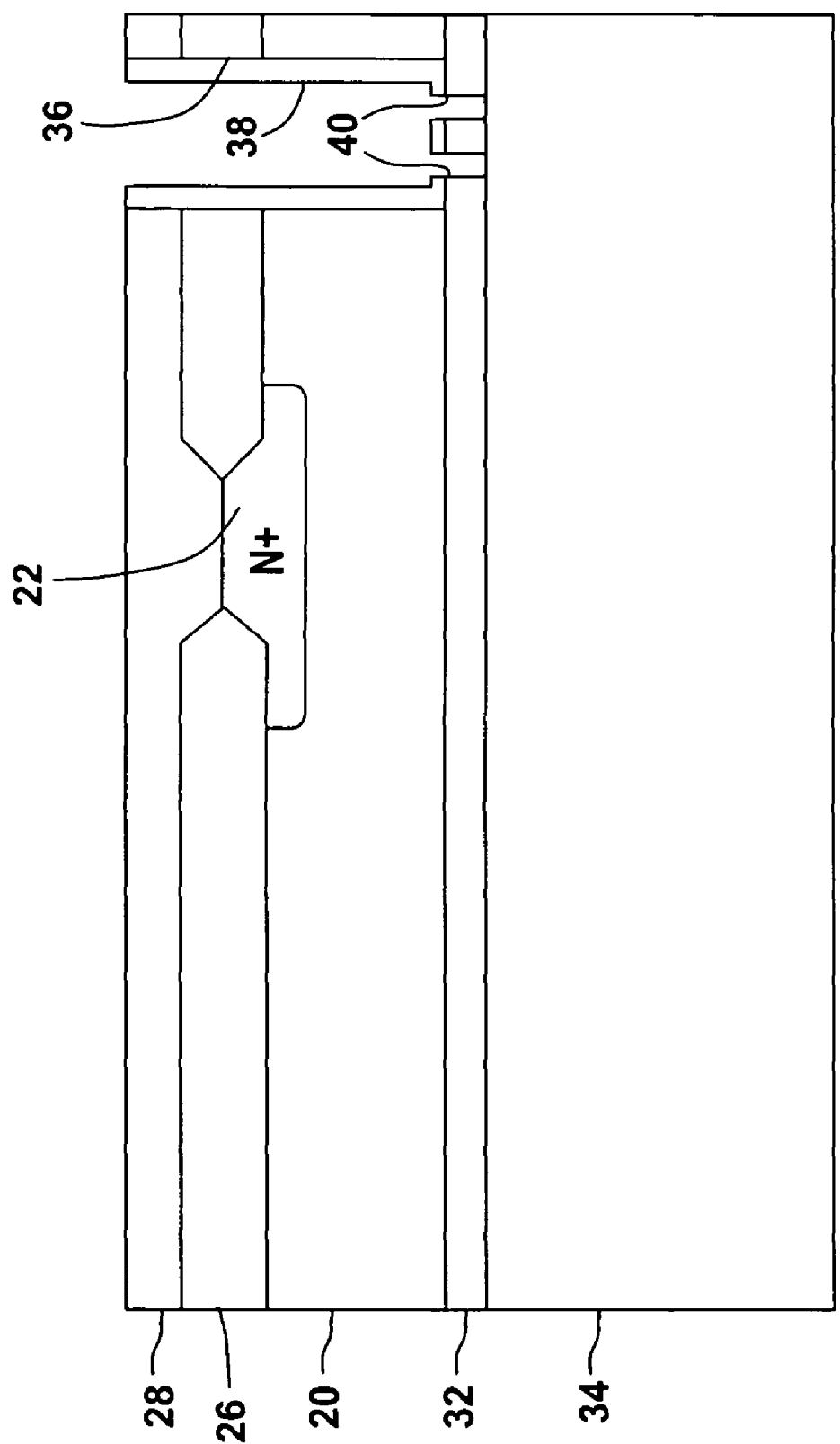

The result of the next step is shown in FIG. 6. Using standard photolithography and RIE techniques, the liner oxide 38 and the buried oxide layer 32 immediately under it is etched, forming a pattern in the form of micro-cavities 40. The micro-cavities 40 will be filled later to provide backside alignment marks for subsequent processing.

Figure 7:
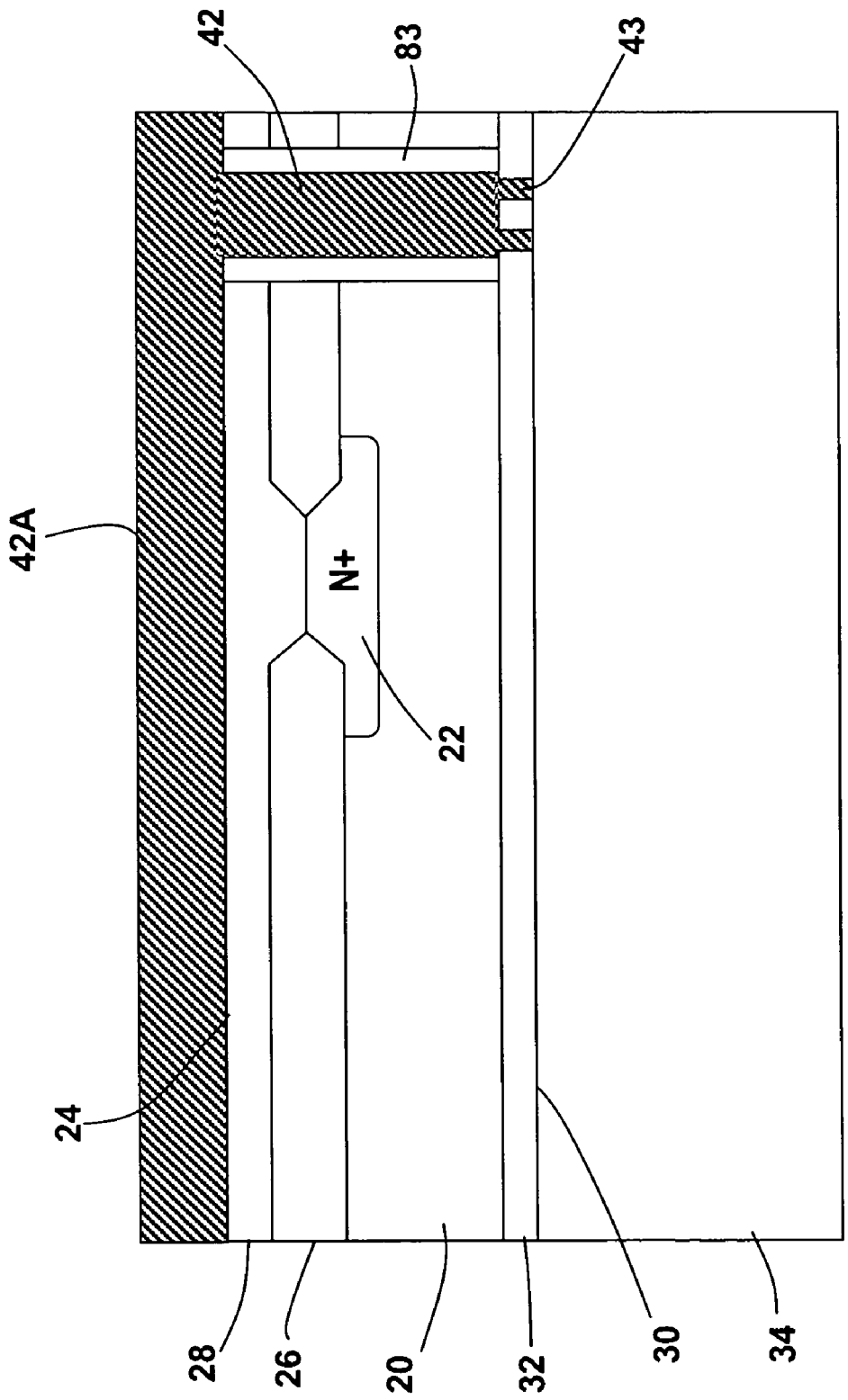
Figure 10:
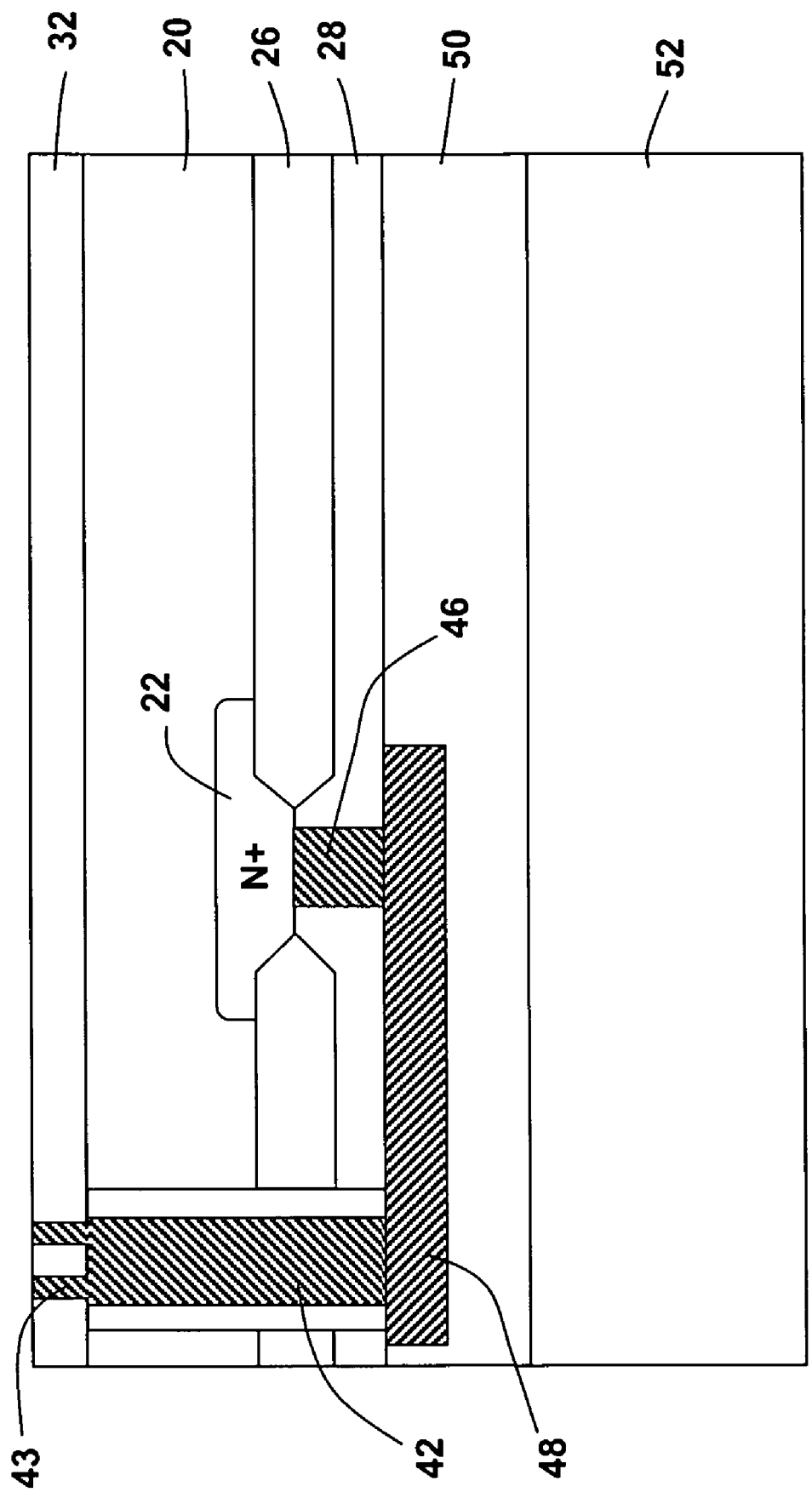
Figure 11:
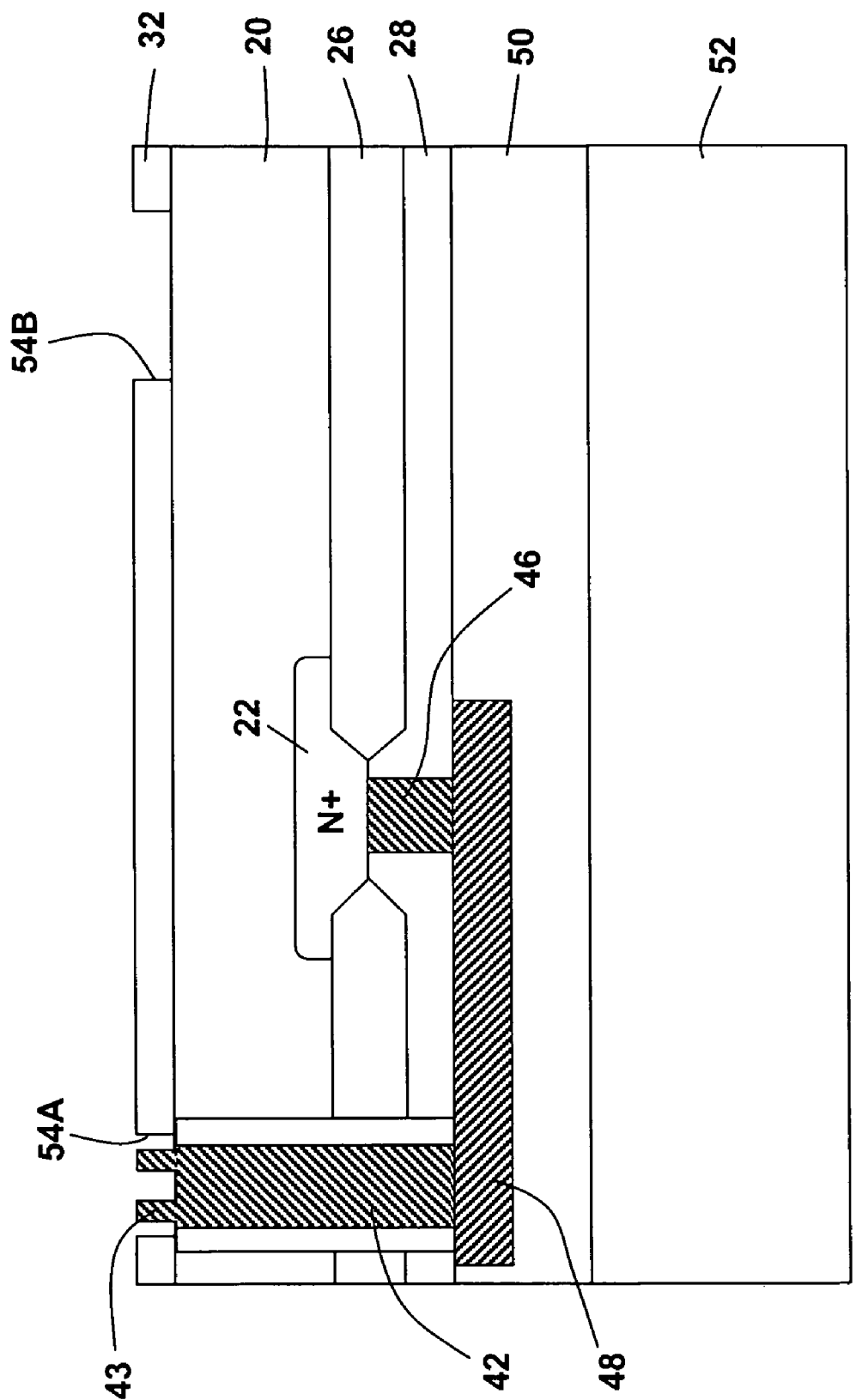
Figure 12:
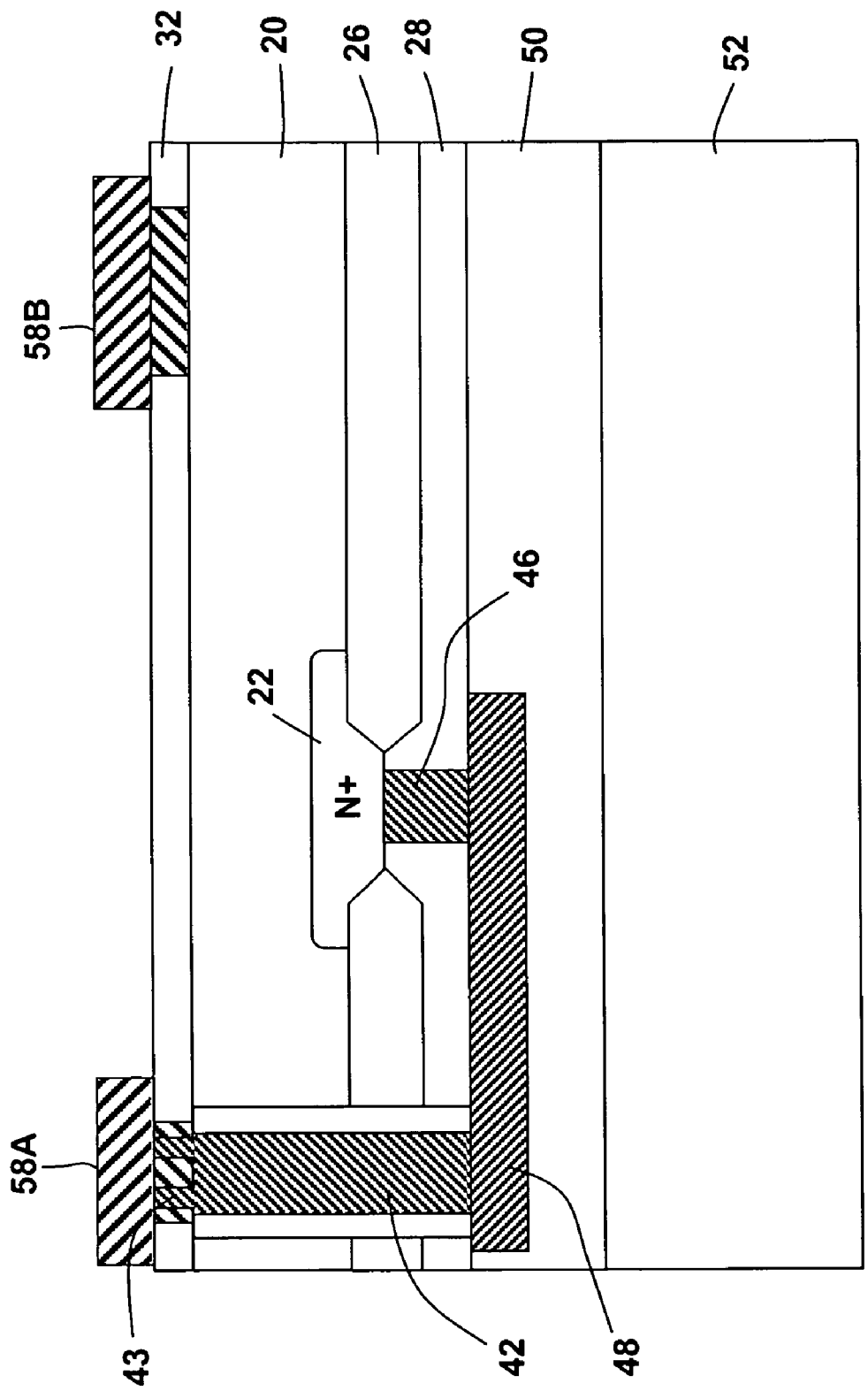
Figure 13:
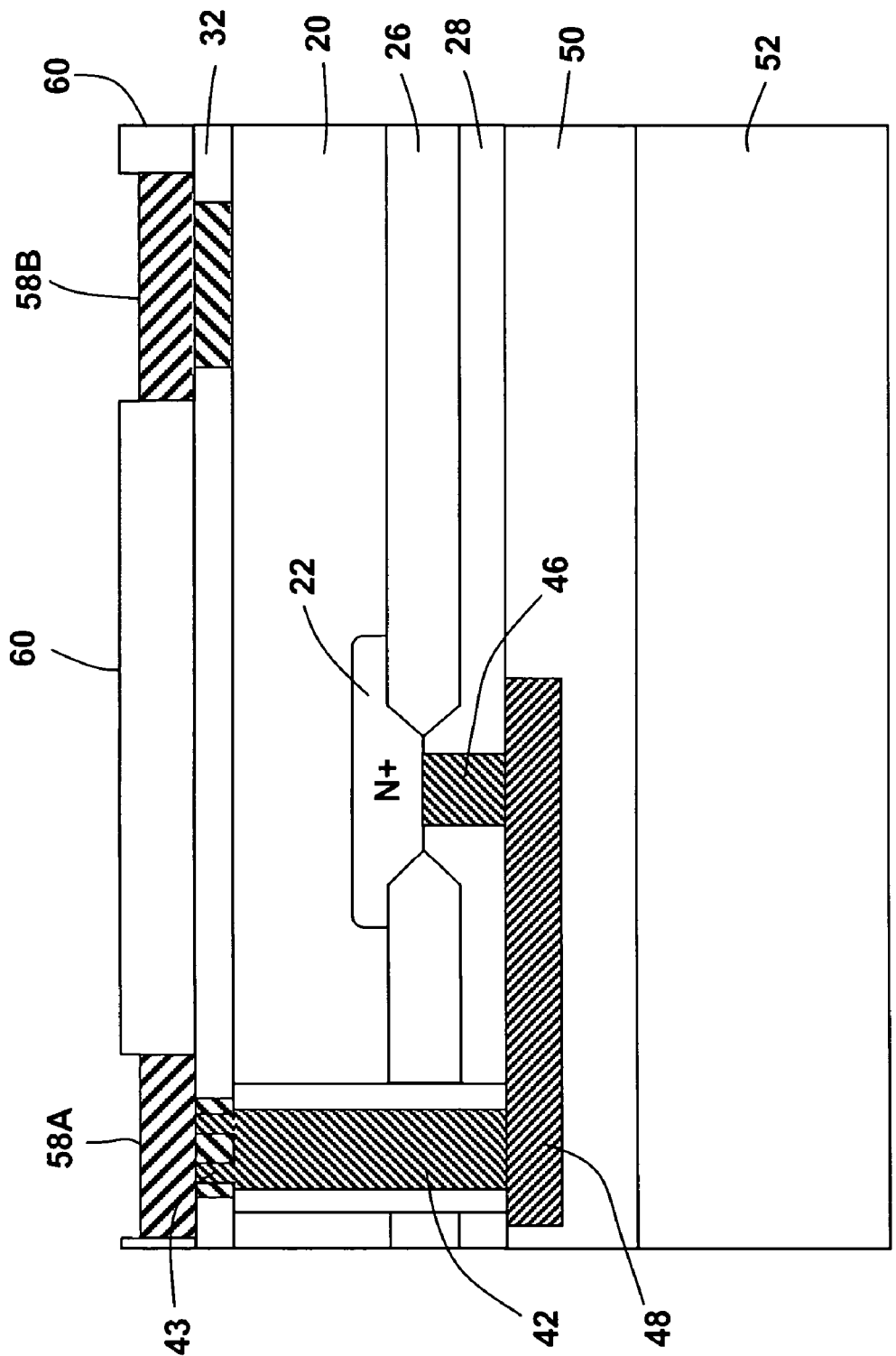

The result of the next step is shown in FIG. 7. The cavity 36 (including the perforations 40) is filled with tungsten via standard sputtering techniques to create a via 42 in the form of a plug of metal extending from the frontside 24 to the backside 30 of the wafer 20. The tungsten is sputtered onto the wafer 20 and thus covers its frontside 24 as well as entering the cavity 36 and the micro-cavities 40. The metal entering the micro-cavity 40 will form a metal alignment key 43, as shown in FIG. 10, which will engage with the metal pad 58A as shown in FIGS. 11-13. It will be understood that materials other than tungsten may be used for making the via 42. For example, copper, titanium or aluminum may be used. In addition, small amounts of other materials may be deposited (as is standard in many available processes) to improve adherence of sputtered metal to the via hole or cavity 36. Such materials may consist of stacks of thin layers of titanium or titanium nitride.

Figure 8:
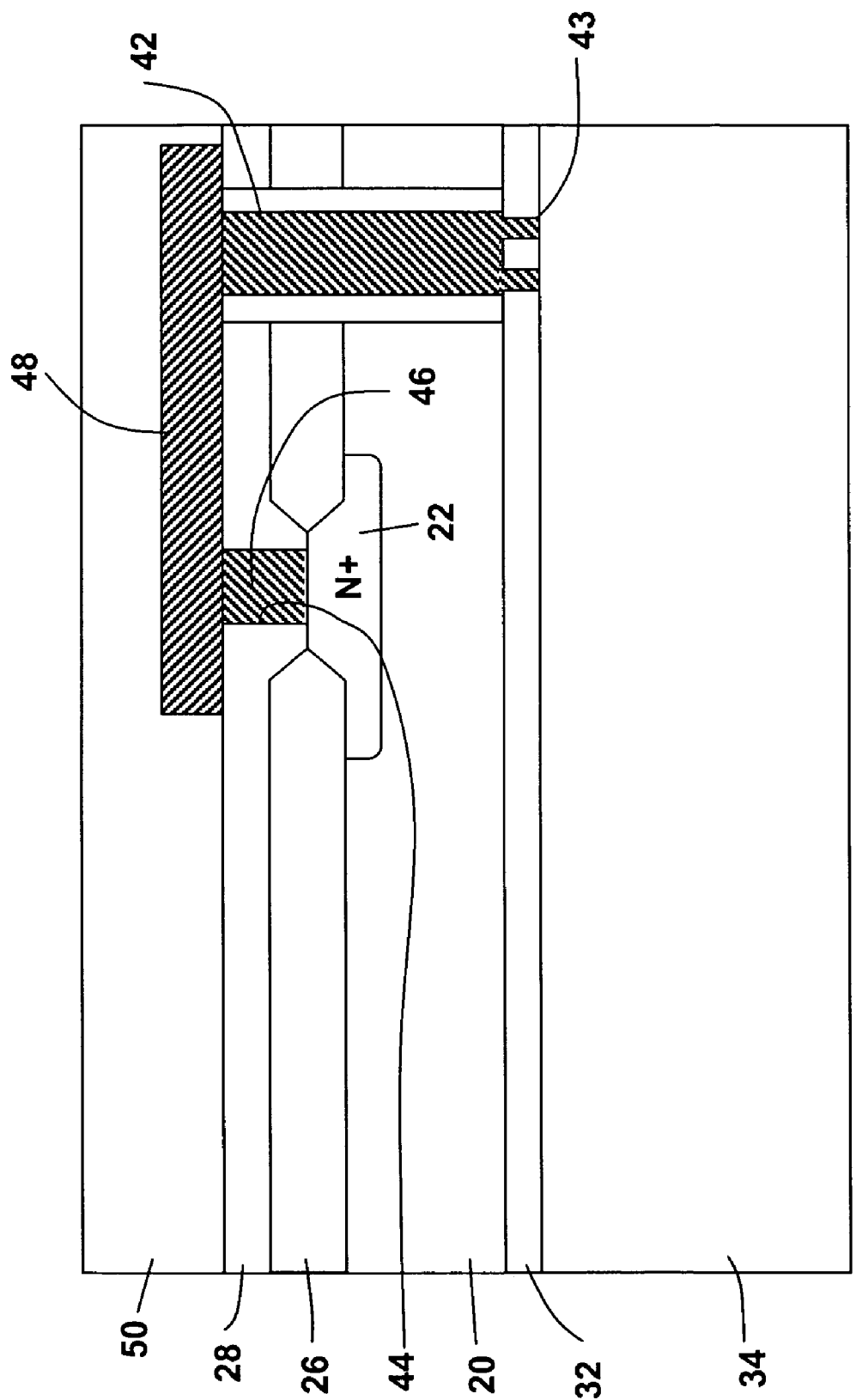

The result of the next steps is shown in FIG. 8. The tungsten layer that had been sputtered on the frontside 24 of the wafer 20 is etched back, a contact hole 44 is opened, such as by photolithographic masking and etching, and the contact hole 44 is filled using typical via-filling methods that consist of sputtering of tungsten that yet again coats the entire wafer. The tungsten is etched back, leaving the contact hole filled with tungsten 46, following which the front metal (e.g., aluminum) 48 is deposited by evaporation and patterned using photolithography and RIE. The front metal 48 is deposited in a pattern that contacts the via 42, and a thick dielectric layer 50 of silicon oxide that forms a layer of the ILD stack is deposited over the frontside 24 and front metal 46.

It should be noted that the processes and structures shown in FIGS. 4-39 describe one metal layer only, in order to simplify the drawings and the associate descriptions. Multiple metal layers (e.g., four) and ILD stacks will be provided in real-life applications and are formed using conventional metal and ILD formation techniques. The connection to the backside will preferably be to the first metal layer, as shown in the processes depicted in FIGS. 4-39. It will be understood that this disclosure is not limited to the provision of any particular number of metal layers and ILDs or equivalent structures.

It should also be noted that the processes and structures shown in FIGS. 4-39 and disclosed in this application may be employed with imagers of any kind such as photodiodes, photogates, and the like. It will be understood that this disclosure is not limited to any particular kind of imager.

Figure 9:
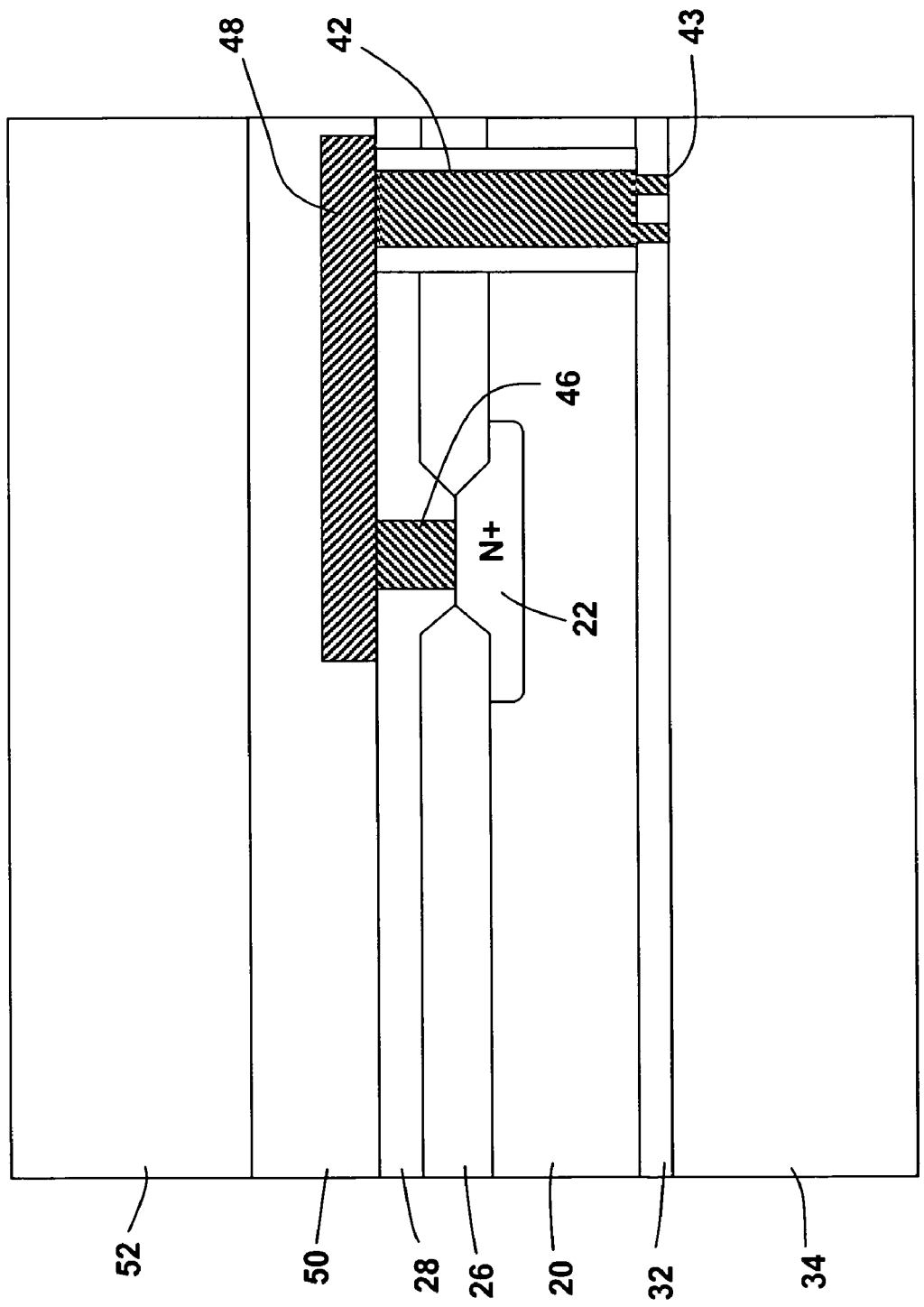

The result of the next step is shown in FIG. 9. A backing substrate 52 in the form of a wafer is attached to the dielectric layer 50. Suitable materials for the backing substrate 52 include glass, quartz, silicon nitride (SiN), and epoxy, although it is to be understood that other materials are suitable. The characteristics desired in the backing substrate 52 include bond-strength, durability and protection against delamination, non-conductivity, mechanical strength sufficient to withstand dicing, minimal outgassing, ability to withstand temperatures as high as melting point of the top surface metal, and thermal expansion compatible with that of the wafer.

The result of the next step is shown in FIG. 10. The handle wafer 34 is removed by etching off the handle wafer 34, stopping on the oxide layer 32, so that the wafer 20 of its starting thickness remains. This is the process that was disclosed in my application Ser. No. 11/226,902, in FIGS. 8-9E and the related specification.

The result of the next step is shown in FIG. 11. The layer of buried oxide 32 is etched away to expose the metal posts 43 and the openings 54A and 54B, using the silicon of the wafer 20 as an etch-stop. The via (filled with metal tungsten) 42 is exposed by the removal of the buried oxide layer 32 with the openings 54A providing alignment marks.

The result of the next step is shown in FIG. 12. Metal (e.g. aluminum) is deposited on the backside 56 of the device filling the openings 54A and 54B. The deposited metal is then patterned using photolithography and etching to provide the metal pads 58A and 58B. The metal pad 58A will connect electrically by way of the via 42 to the front metal 48. The metal pad 58B connected to the back surface of silicon 20 will serve as the silicon wafer 20 backside electrical contact. The metal pads 58A and 58B can serve as second or backside alignment marks or features that can permit the positioning of color filter and microlens arrays on the backside of the wafer above the imager structures in the wafer. It will be understood that other alignment marks or features in addition to pads, such as cross-hairs and the like, may be provided for the same purpose by using the metal posts 43 as a positioning guide for the deposition or other method of formation of such other alignment marks or features.

The result of the next steps is shown in FIG. 13. A protective or passivative layer 60 is formed over the backside 56 by deposition and patterning. The protective layer or 60 may be made of plasma-enhanced chemical vapor deposition (PECVD) of silicon nitride, followed by hydrogen annealing. The protective layer presents a barrier to moisture and undesirable mobile ions (such as sodium) and guards against device performance degradation to such contaminants. An exemplary thickness of the liner 60 is 0.6 microns. For electrical connection purposes, the protective layer 60 is removed over the metal pads 58A and 58B by photolithography and etching. Hydrogen annealing may occur before or after silicon etching. The effect of annealing is to passivate interface traps that may have been present during the device processing or introduced during backside thinning, cavity formation, and subsequent metallization steps, and thereby improve quantum efficiency and dark current performance of the imager.

Figure 14:
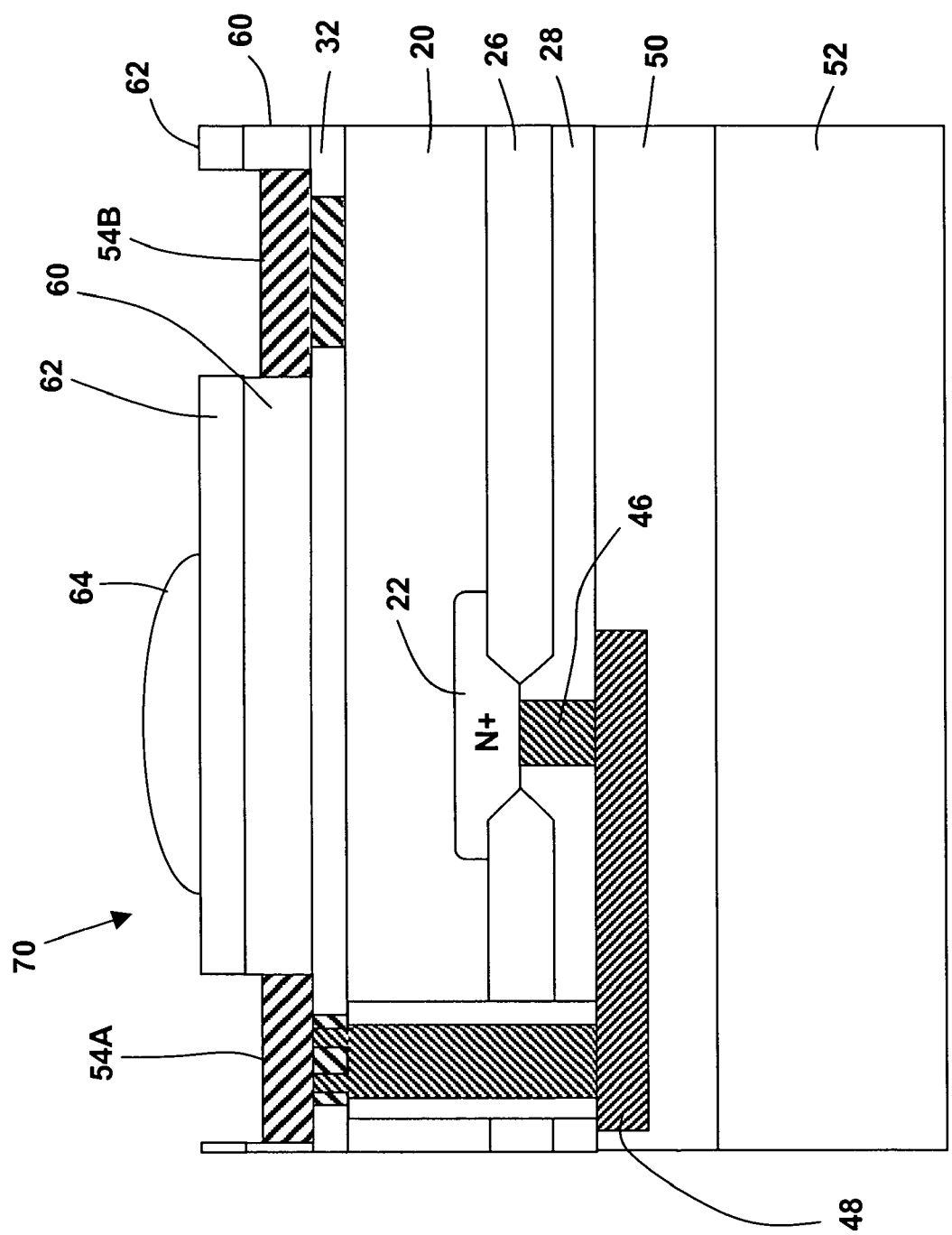
Figure 32:
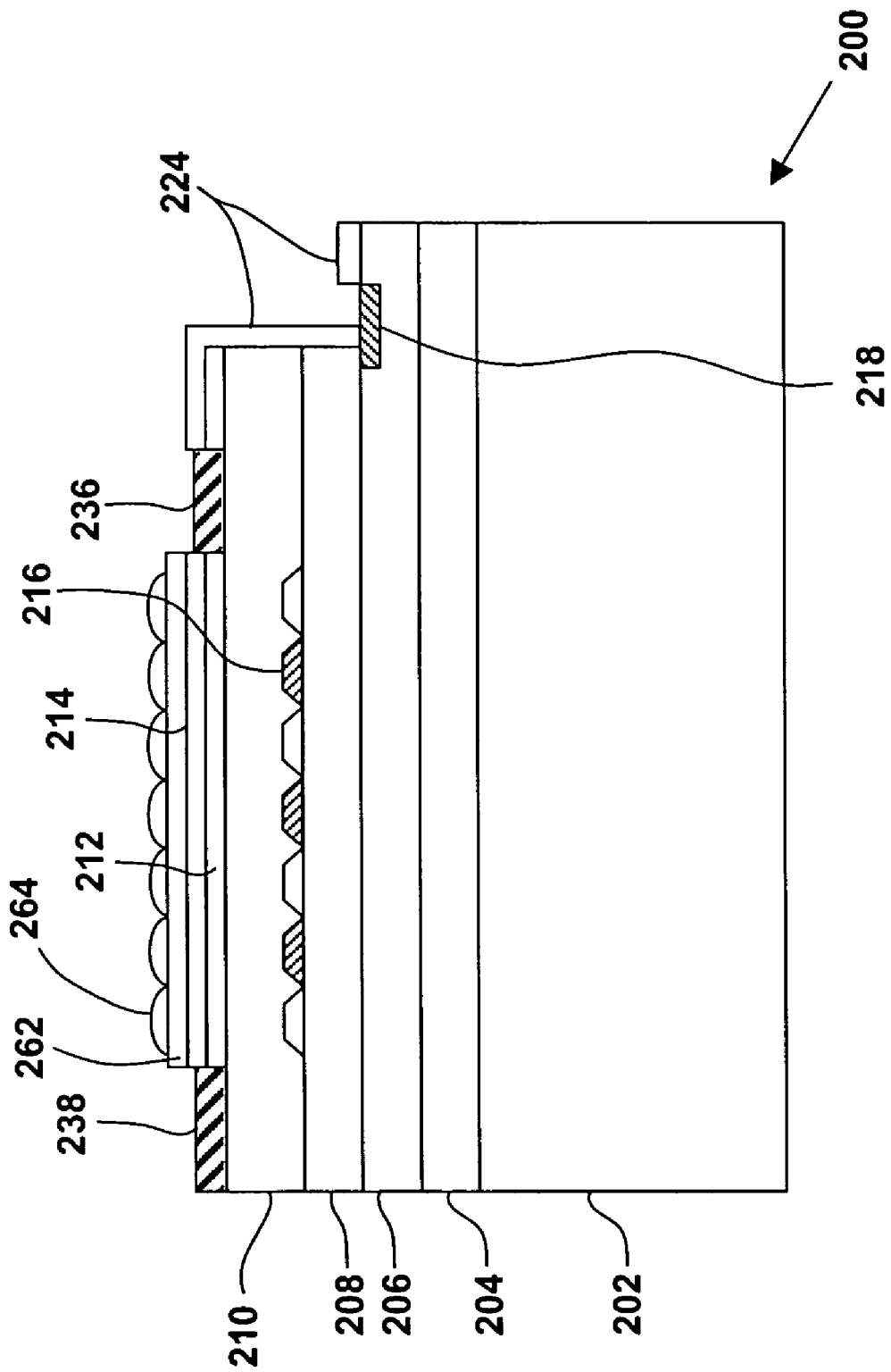
Figure 39:
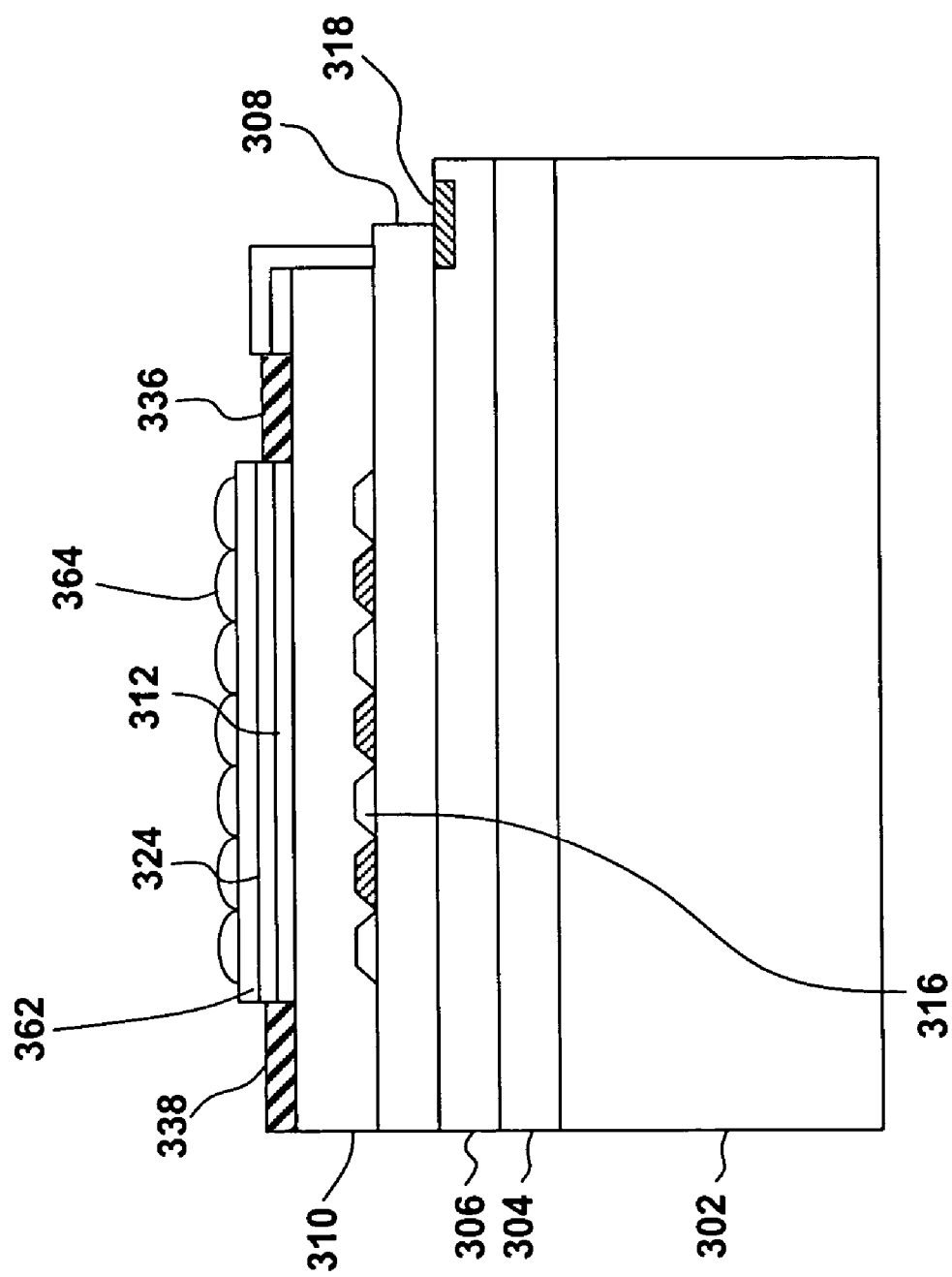

The result of the next steps is shown in FIG. 14. A color filter array 62 and a microlens 64 are deposited on the protective layer 60 between the metal pads 58A and 58B. (Only one color filter 62 and one microlens 64 is shown in FIG. 14 but it will be understood that an array of color filters and an array of micro lenses may be provided, one of each for each pixel, as shown in FIGS. 32 and 39.) Color filter array and microlens array deposition is proprietary to the manufacturer, such as Toppan. The metal pads 58A and 58B serve as alignment marks for the deposition of the color filter array 62 and the microlens array 64 on the protective layer 60 in proper orientation above the wells corresponding to the pixels so that the pixels will each have an appropriate filter and microlens above it. The backside-illuminated imager with standard packaging, generally indicated by reference numeral 70, is now formed.

Another and second preferred method according to the disclosure for making a backside-illuminated imager with standard packaging is shown in FIGS. 15-24.

Figure 15:
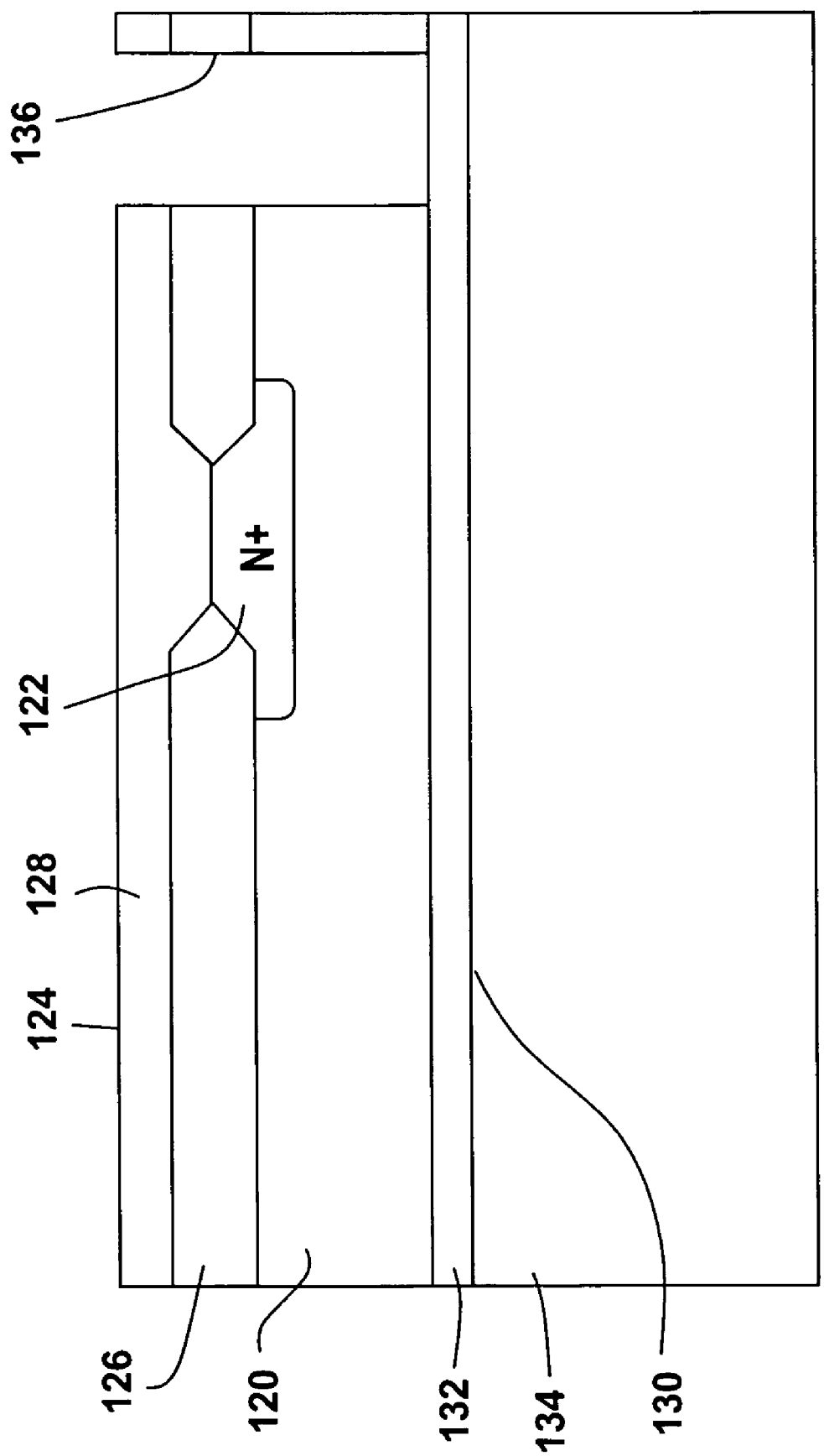
FIGS. 15-24 show schematic cross-sectional views of a backside-illuminated imager at successive steps of its preparation according to a second preferred method for preparing backside-illuminated imagers.

FIG. 15 shows schematic cross-section of a semiconductor wafer 120 having electronics 122 (here an N+ well), a deposited oxide layer 128, and a handle wafer 134 attached to the backside 130. A cavity 136 for later use in a via is formed between a frontside 124 and a buried oxide layer 132 by RIE. The configuration of the components in FIG. 14 is shown to be the same as that in FIG. 3, and may be formed by the same methods.

Figure 16:
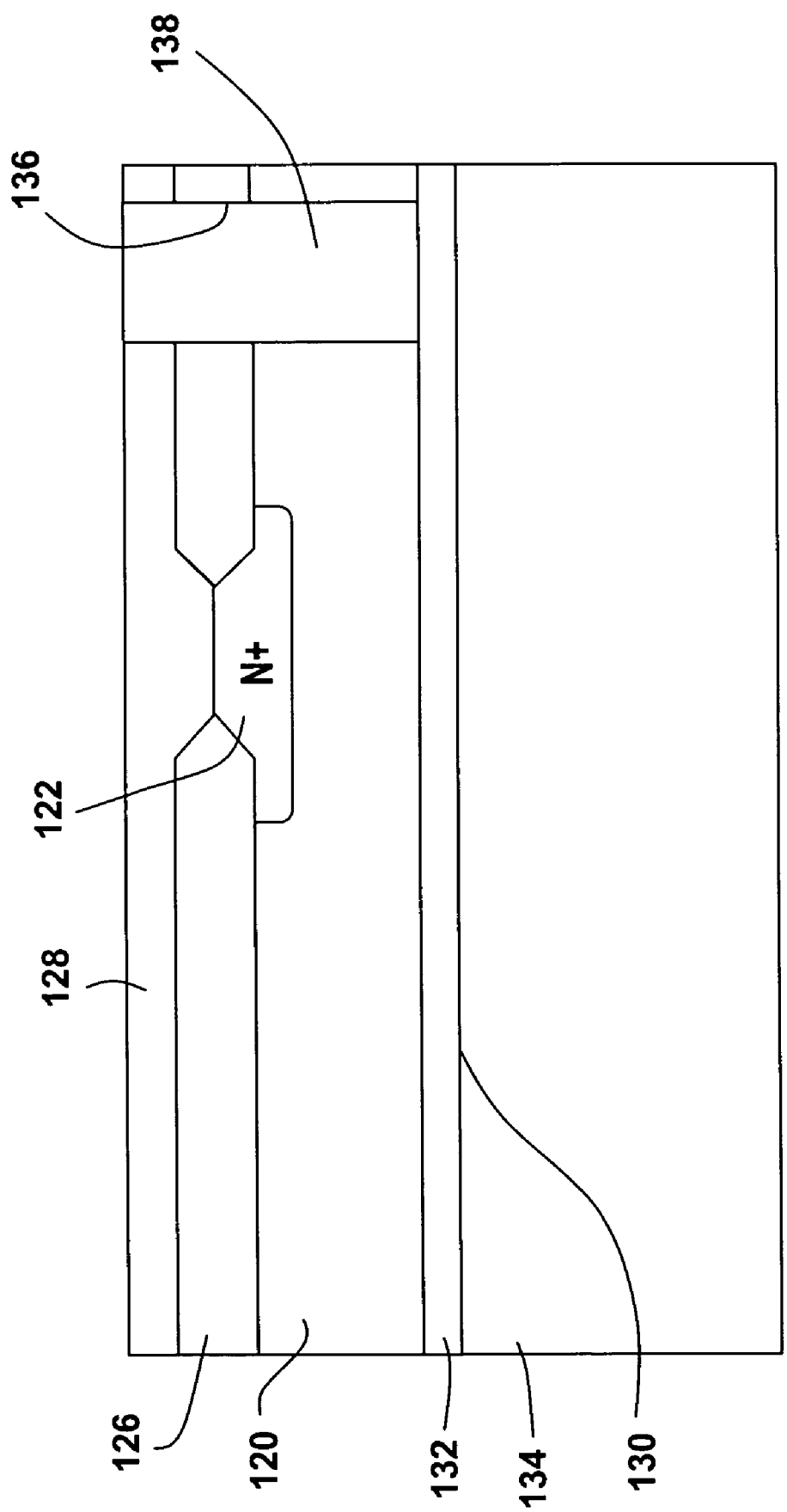

FIG. 16 shows the result of the next steps. The via-hole or the cavity 136 is filled with layers of liner oxide and deposited silicon oxide 138 (this process may also be used to provide the liner oxide 38 in the first preferred process). The oxide stack 138 also covers the deposited oxide layer 128 (not shown) but is removed down to the deposited oxide in a planarizing step. The oxide filling the cavity provides the necessary electrical isolation of one cavity from another, as well as from the adjacent silicon, during via formation in subsequent steps.

Figure 17:
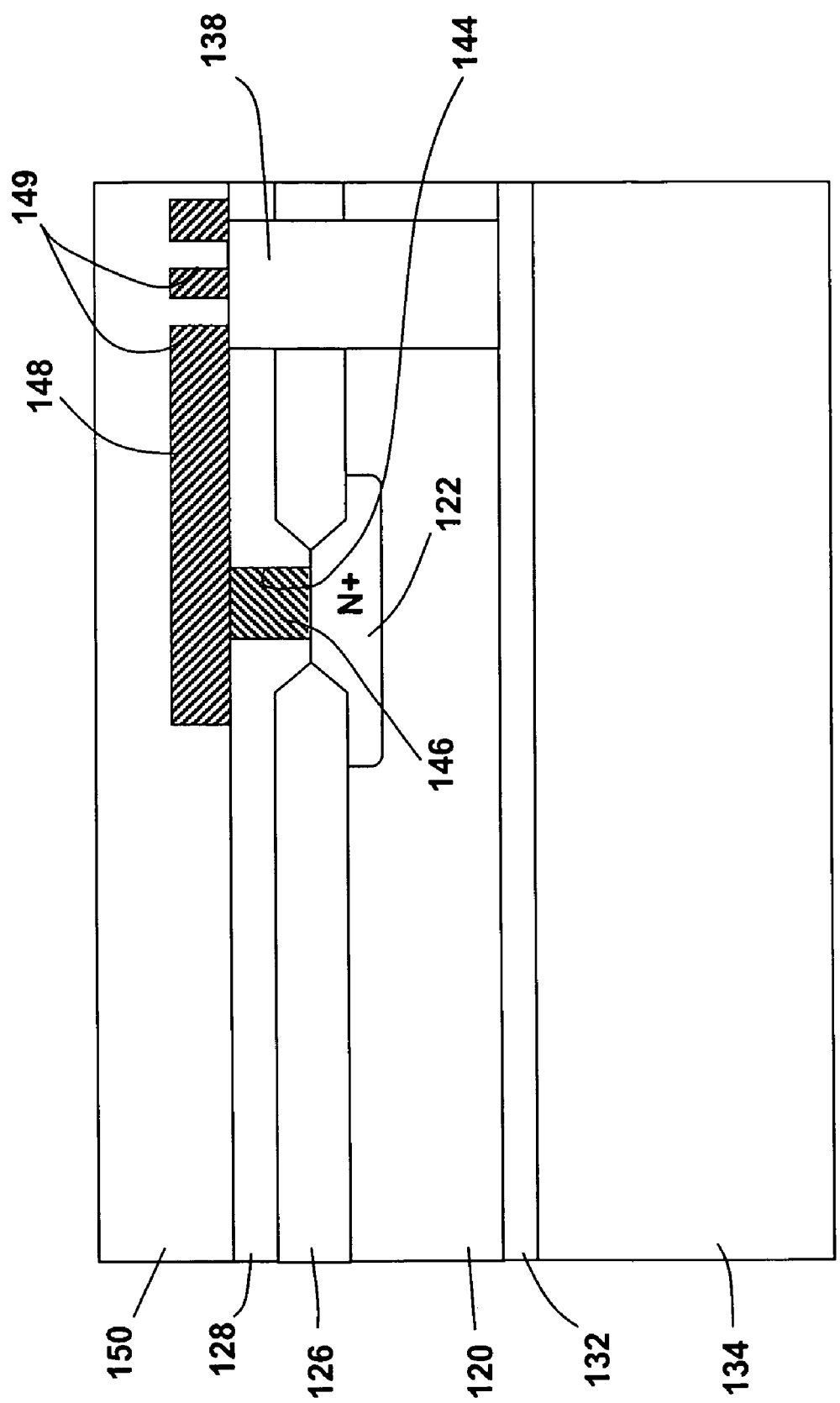

The result of the next steps is shown in FIG. 17. A contact hole 144 is opened such by masking and etching, the contact hole 144 is filled with the tungsten 146 as in the first preferred process (please see the discussion with respect to FIG. 8), the front metal 148 is deposited so that it is contacting the oxide stack 138 filling the cavity 136. The front metal 148 is then patterned and etched, contacting the contact fill 146, and forming alignment marks 149 oriented in front of the cavity or via hole 136, and is coated with the first inter-level dielectric—150 of silicon. The alignment marks 149 serve as first alignment marks or features that ultimately can permit the positioning of color filter and microlens arrays on the backside of the wafer above the imager structures in the wafer.

Figure 18:
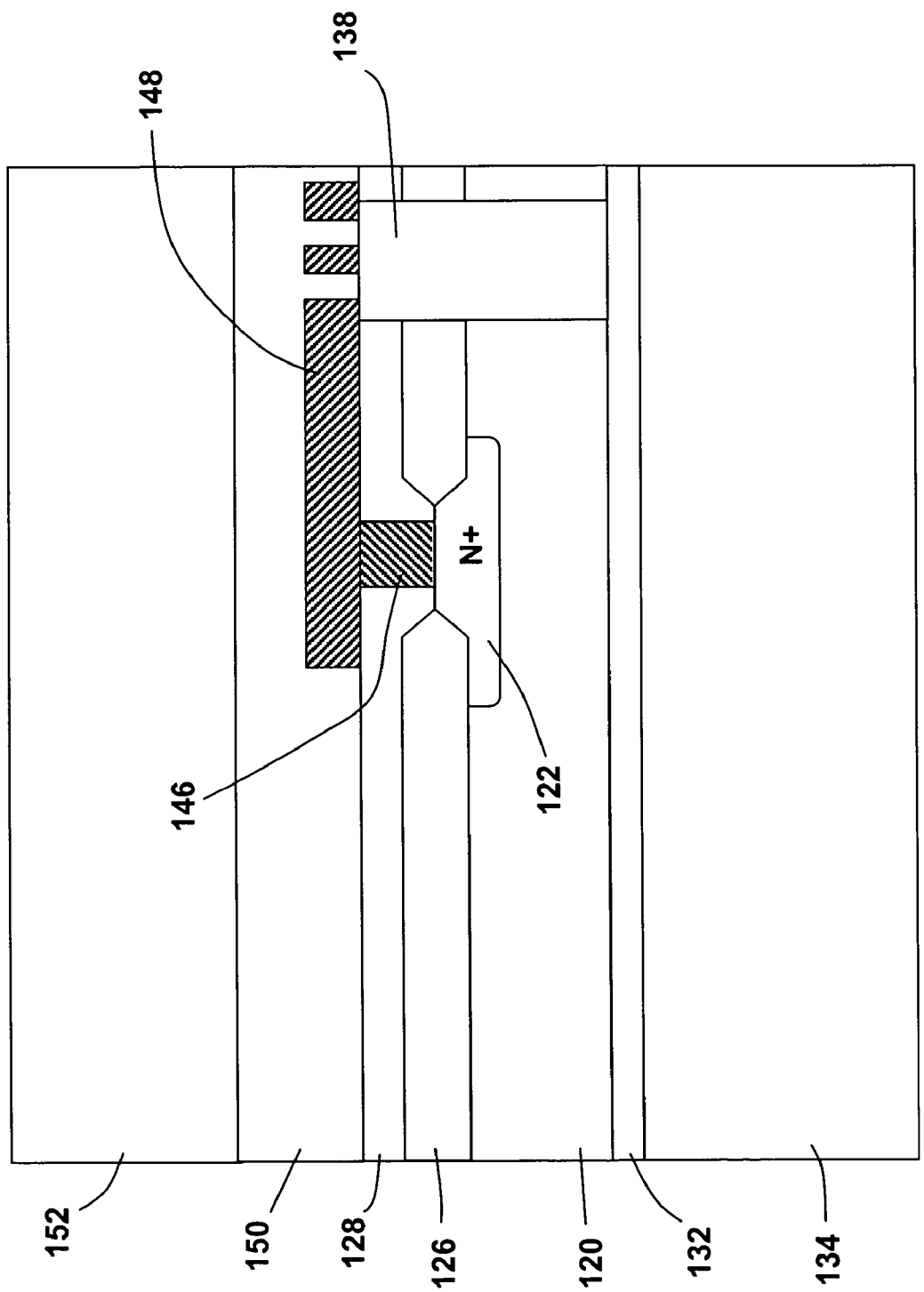

The result of the next step is shown in FIG. 18. A backing substrate 152 in the form of a wafer is attached to the protective oxide layer 150. Suitable materials for the backing substrate 152 include glass, quartz, silicon nitride (SiN), and epoxy, although it is to be understood that other materials like these materials are suitable. The characteristics desired in the backing substrate 152 include the same characteristics that were desirable for the backing substrate 52 of the first preferred process.

Figure 19:
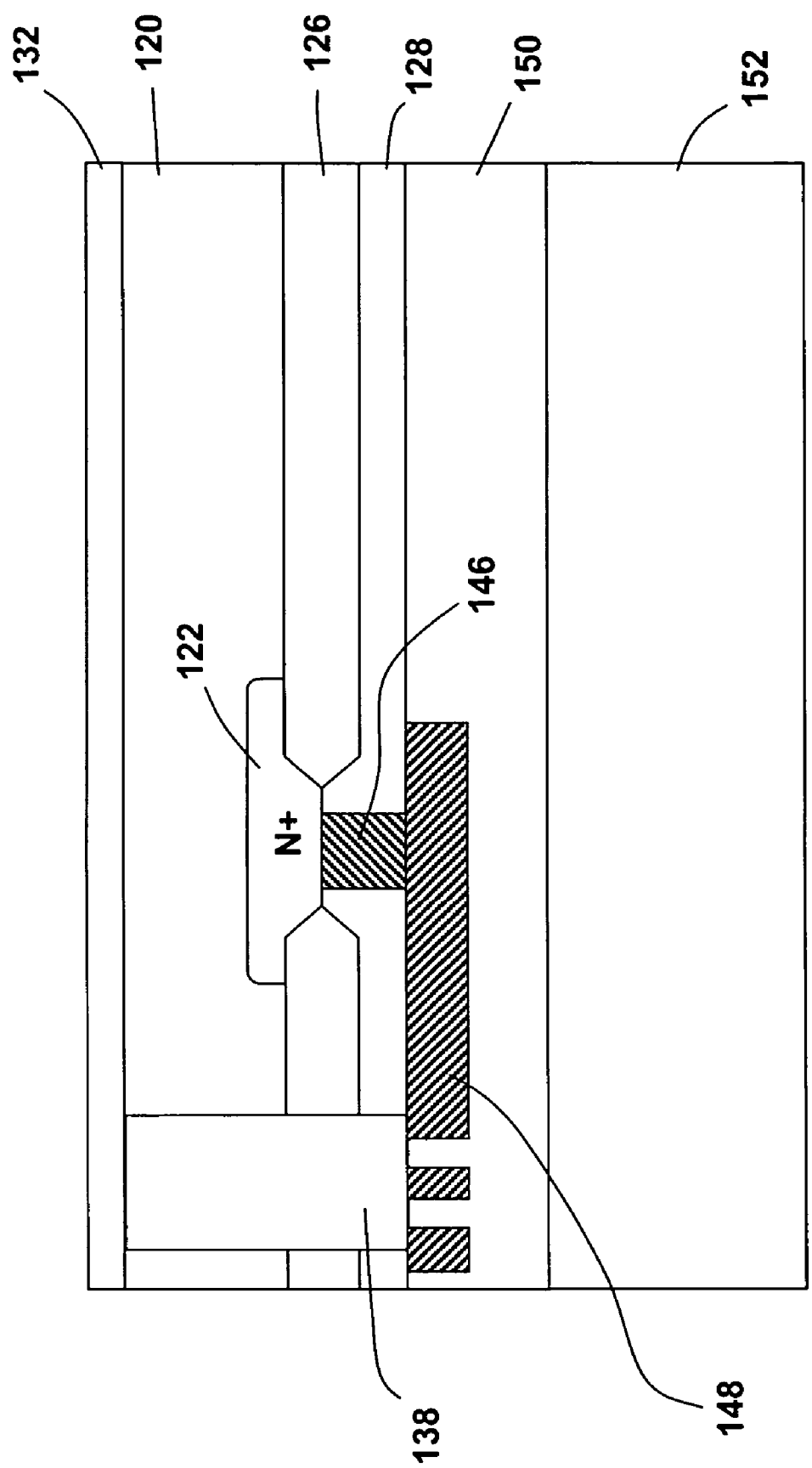

The result of the next step is shown in FIG. 19. The handle wafer 134 is removed down to the buried oxide layer 132, as described in connection with FIG. 10 for the first preferred process.

Figure 20:
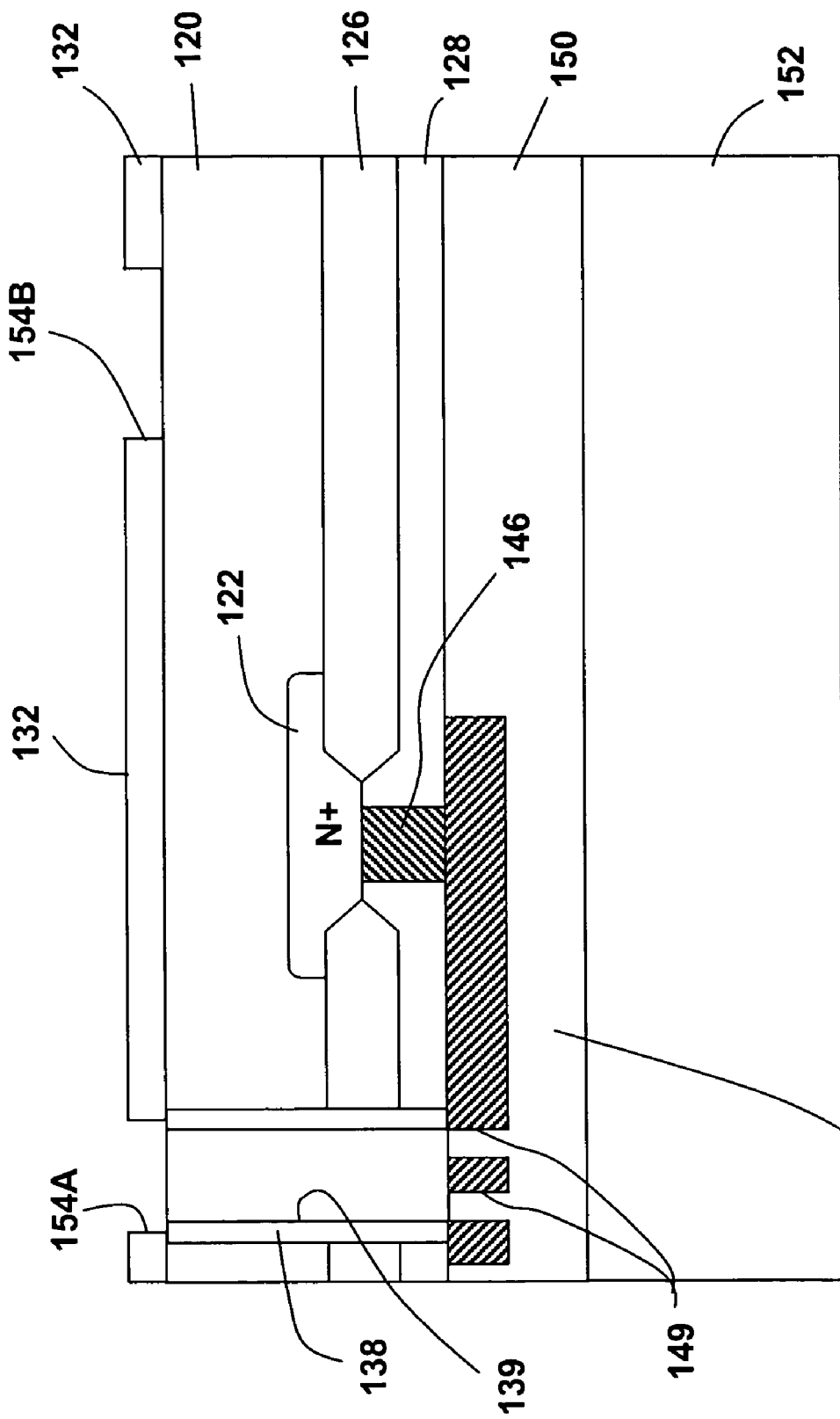

The result of the next steps is shown in FIG. 20. Using the frontside metal alignment marks, which will be visible through the liner oxide 138, the layer of buried oxide 132 is etched away to form openings 154A and 154B. Using another photomask that is aligned to the previous one, the liner oxide 138 is etched off in the opening 154A and a cavity 139 is formed in the liner oxide 138 by trench etching until the metal layer or front metal 148 on the front side is reached. The buried oxide 132 is etched to create the opening 154B, using the silicon of the wafer 120 as an etch-stop. The liner oxide 138 etch and the buried oxide 132 etch may happen in two separate photolithography steps.

Figure 21:
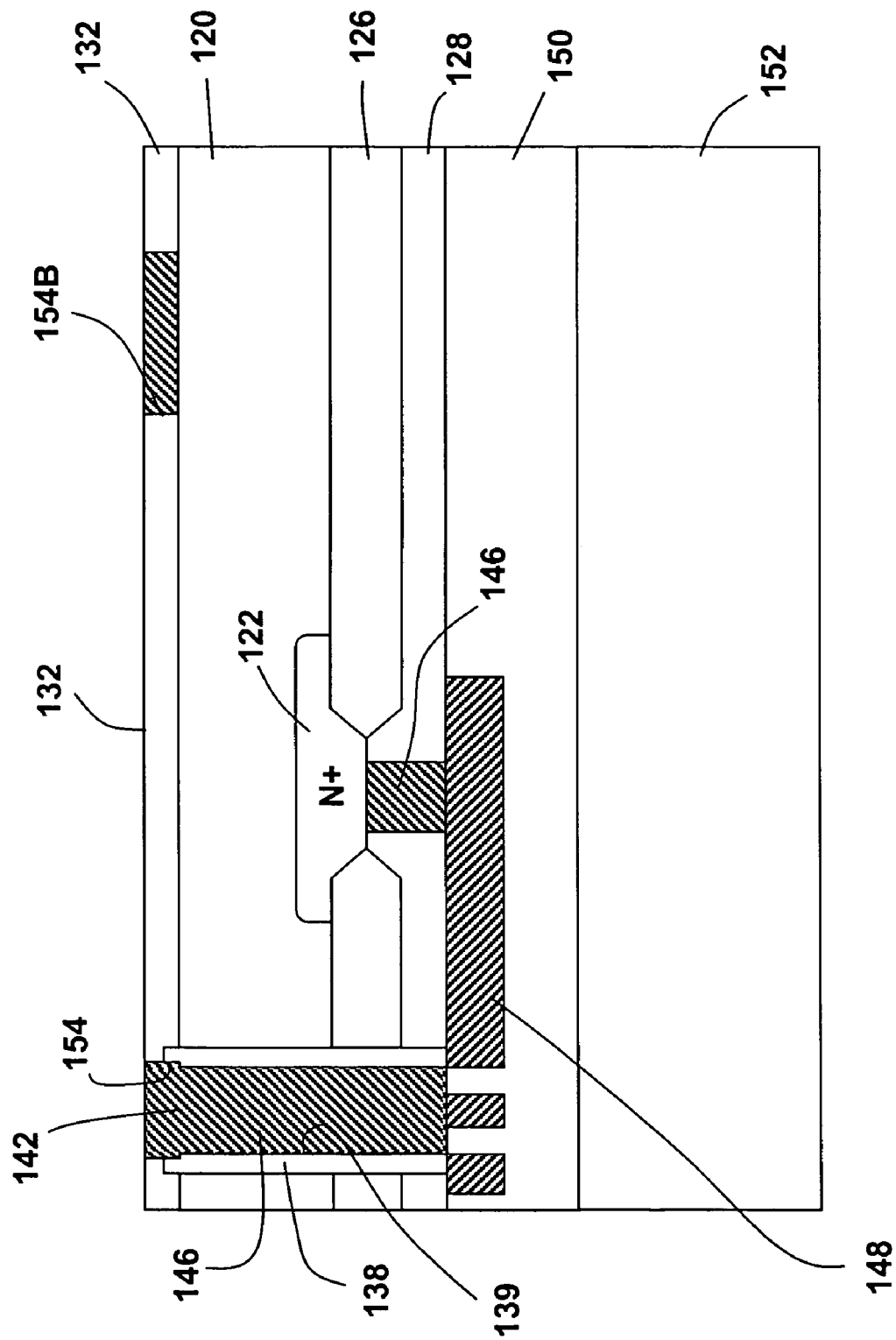

The result of the next steps is shown in FIG. 21. The cavity 139 is filled with metal by a step of sputtering or the like in order to make a via 142. The metal may be tungsten or titanium. The metal is removed by patterned etching to 154A in the buried oxide layer 132.

Figure 22:
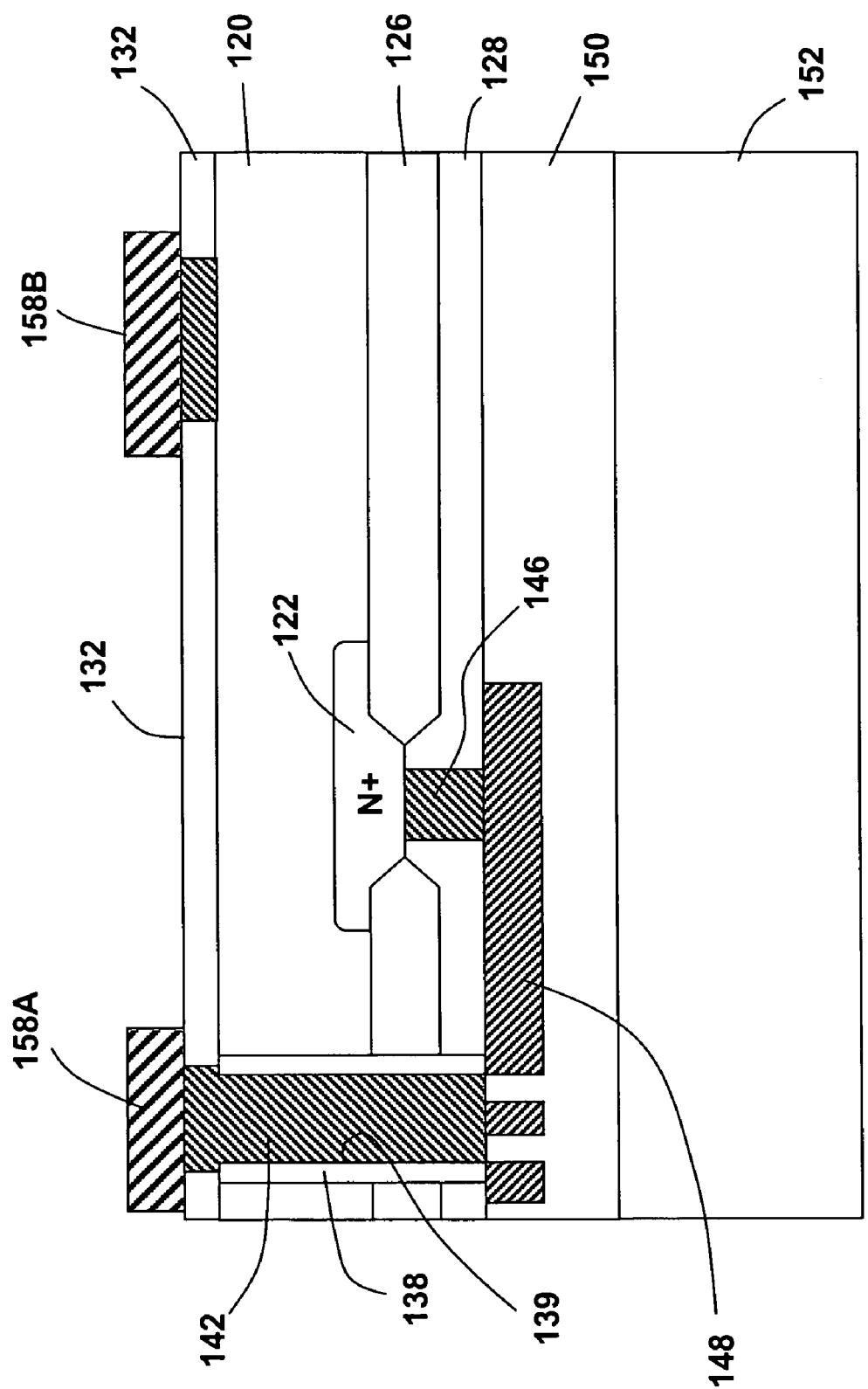

The result of the next step is shown in FIG. 22. Metal is deposited and patterned to form metal pads 158A and 158B corresponding to the openings 154A and 154B. The metal may be deposited by sputtering. The metal pad 158A will connect electrically by way of the via 142 to the front metal 148. The metal pad 158B connected to the back surface of silicon 120 and will serve as the silicon wafer 20 backside electrical contact. The metal pads 158A and 158B can serve as second or backside alignment marks or features that can permit the positioning of color filter and microlens arrays on the backside of the wafer above the imager structures in the wafer. It will be understood that other alignment marks or features in addition to pads, such as cross-hairs and the like, may be provided for the same purpose by using the via 142 as a positioning guide for the deposition or other method of formation of such other alignment marks or features. Alternatively, and even before the formation of the via-hole or the cavity 136 and the via 142, the alignment marks 149 may be observed from the backside through the oxide 138 in order to orient alignment marks or features on the backside.

Figure 23:
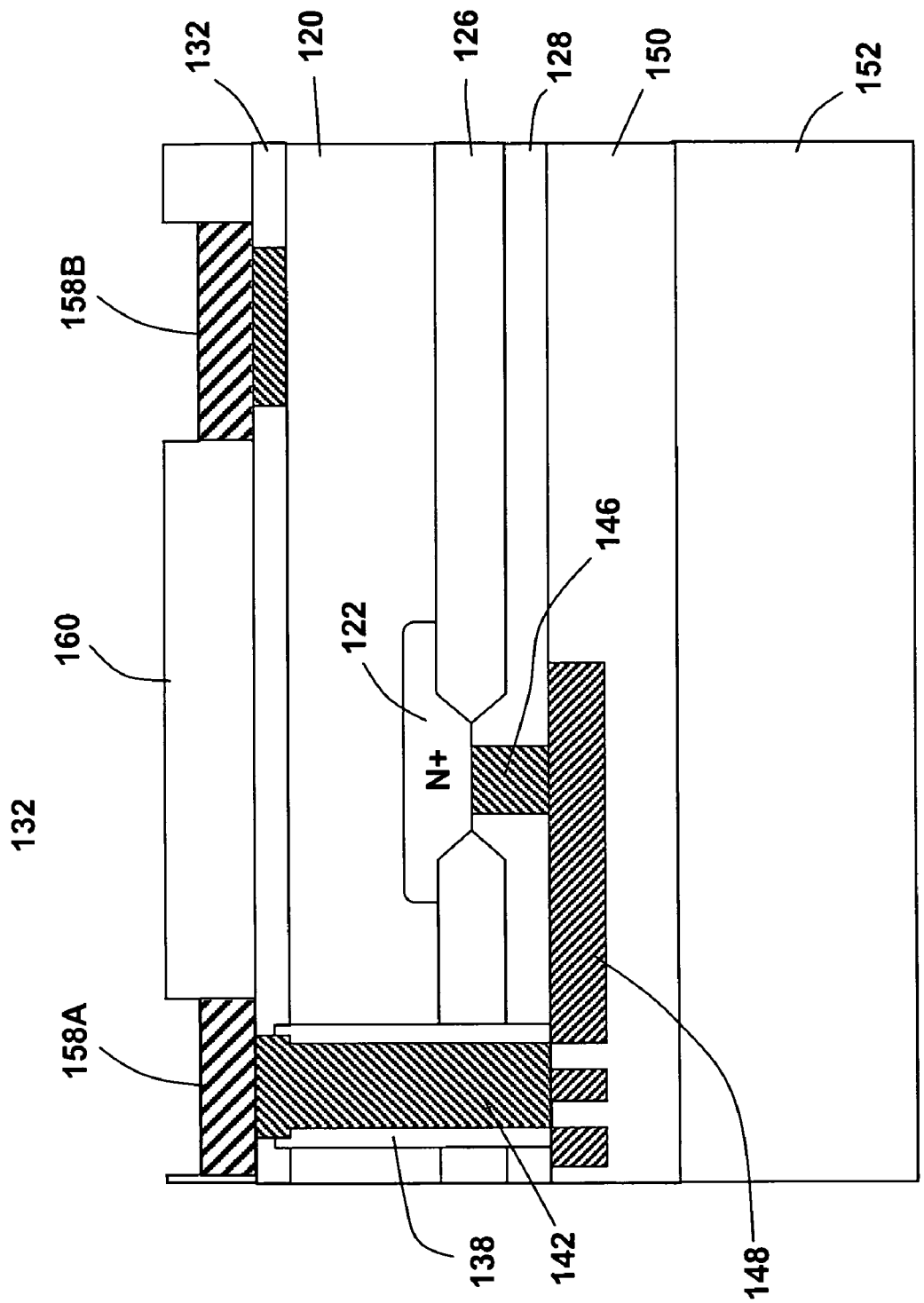

The result of the next steps is shown in FIG. 23. A protective or passivative layer 160 is formed over the backside 56 by deposition and annealing. The protective layer 160 may be made using plasma-enhanced chemical vapor deposition (PECVD). Materials such as silicon nitride are suitable. The protective layer presents a barrier to moisture and undesirable mobile ions (such as sodium) and guards against device performance degradation to such contaminants. An exemplary thickness of the liner 160 is 0.6 microns. For electrical connection purposes, the protective layer 160 is removed over the metal pads 158A and 158B by photolithography and etching. Hydrogen annealing may occur before or after silicon etching. The effect of annealing is to passivate interface traps that may have been present during the device processing or introduced during backside thinning, cavity formation, and subsequent metallization steps, and thereby improve quantum efficiency and dark current performance of the imager.

Figure 24:
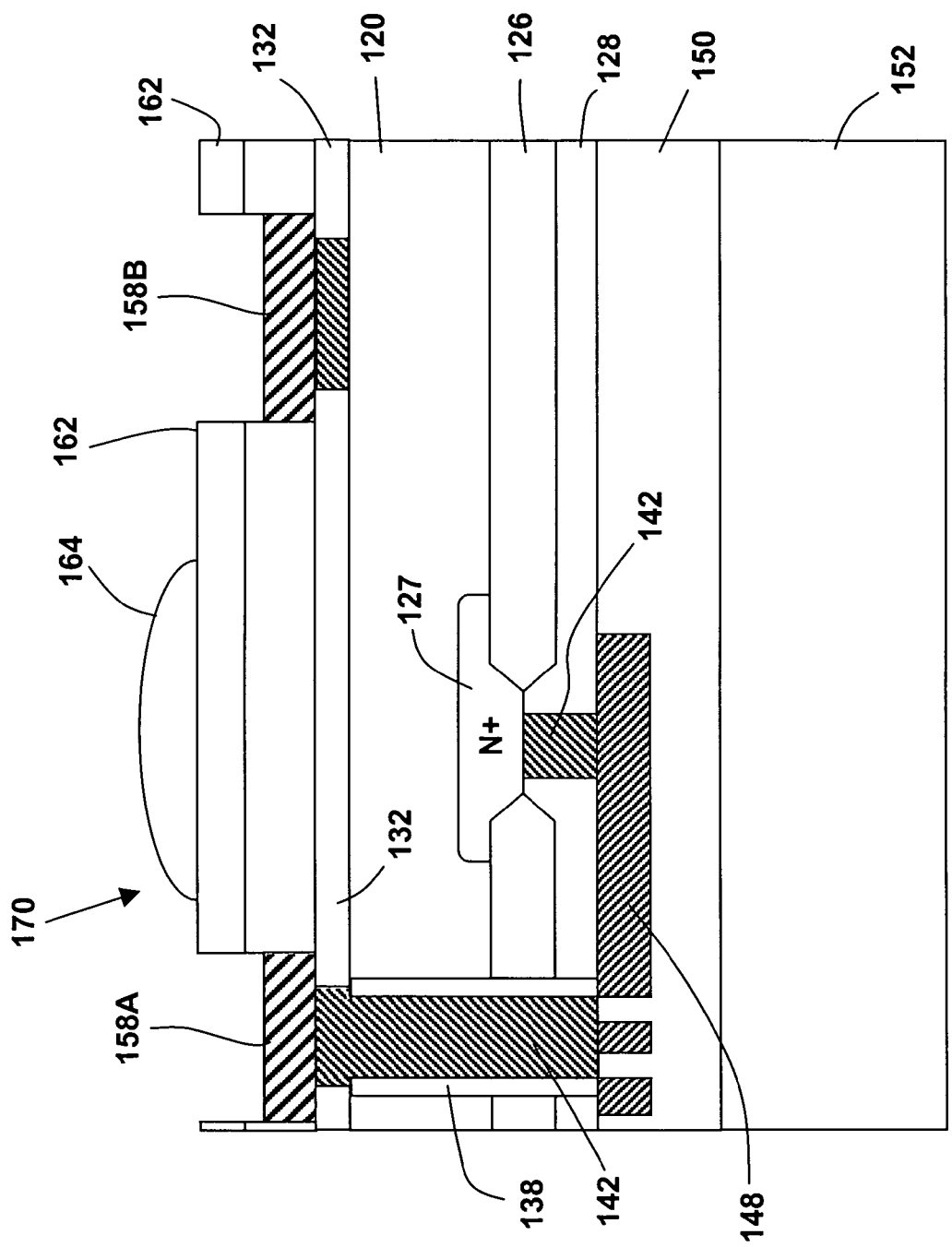

The result of the next step is shown in FIG. 24. A color filter 162 and a microlens 164 are deposited on the protective layer 160 between the metal pads 158A and 158B. (Only one color filter 162 and one microlens 164 are shown in FIG. 14 but it will be understood that an array of color filters and an array of micro lenses may be provided, one of each for each pixel, as shown in FIGS. 32 and 39.) Color filter array and microlens array deposition is proprietary to the manufacturer, such as Toppan. The metal pads 158A and 158B serve as alignment marks for the deposition of the color filter array 162 and the microlens array 164 on the protective layer 160 in proper orientation above the wells corresponding to the pixels so that the pixels will each have an appropriate filter and microlens above it. A backside-illuminated imager with standard packaging, generally indicated by reference numeral 170, is now formed.

The third and fourth preferred processes described next provide I-O pads and alignment marks/features after the frontside of the imager has been attached to its a substrate. A common general aspect of these processes is the creation or delving of cavities from the backside to permit access to previously embedded conductors from the backside, whereas in the first and second preferred processes the cavities are created from the front side, followed by filling to make vias connecting frontside metal connections to I-O pads formed on the backside.

An advantage of the third and fourth preferred processes is the elimination of the necessity to perform steps on both sides of the imager to access the frontside electronics. In addition, the aspect ratios of the structures formed during various microfabrication processes are smaller than those in the first and second processes. By this is meant that the vertical extents of the structures provided for connecting backside I-O pads or the like to frontside electronics are less than the horizontal extents of these structures. Therefore, the third and fourth processes may have improved process stability and yield.

Another and third preferred method according to the disclosure for making a backside-illuminated imager with standard packaging is now shown in FIGS. 25-32.

Figure 25:
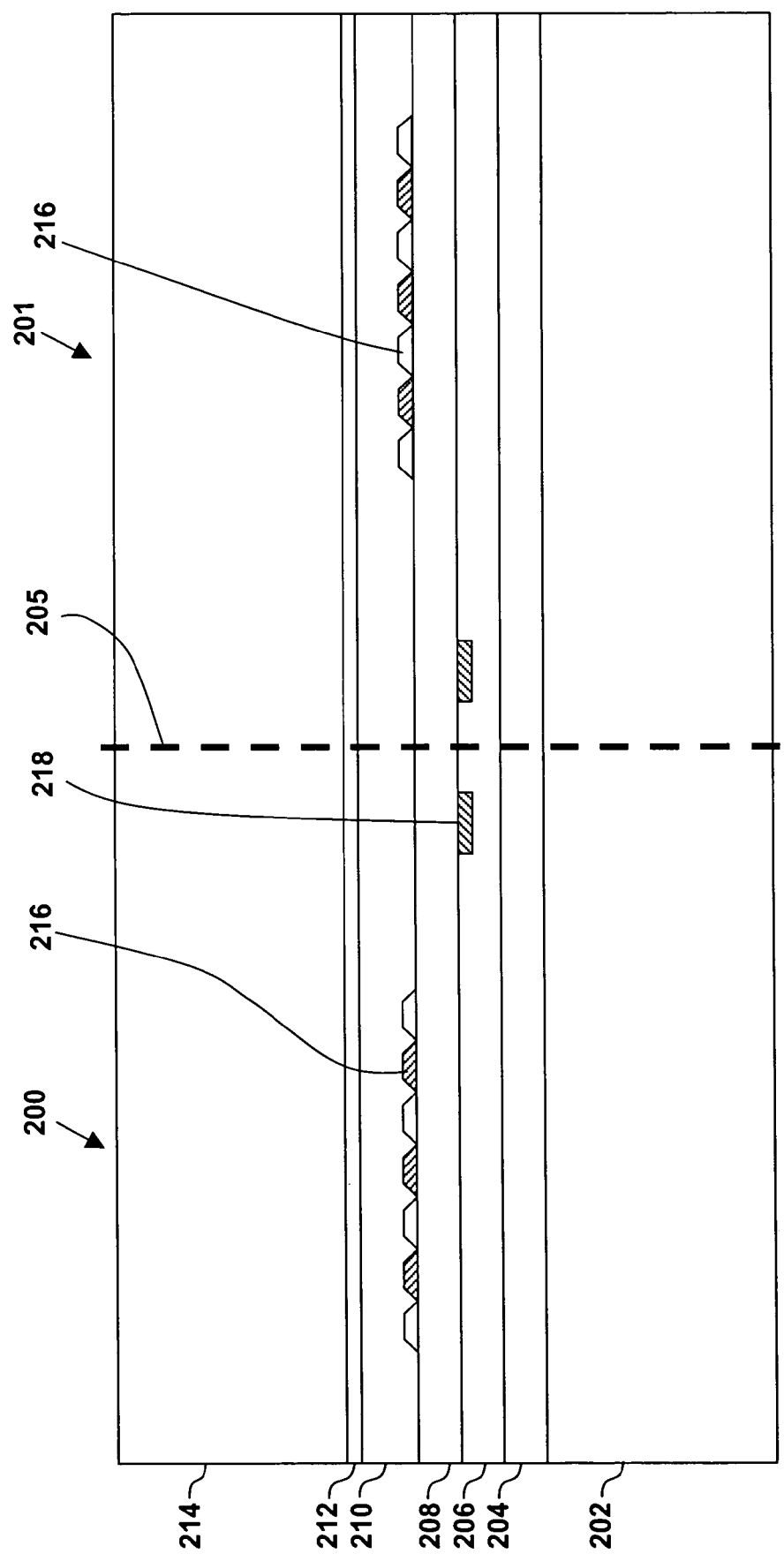
FIGS. 25-32 show schematic cross-sectional views of a backside-illuminated imager at successive steps of its preparation according to a third preferred method for preparing backside-illuminated imagers.

FIG. 25 shows two backside-illuminated imagers 200 and 201 prior to dicing along the dashed line indicated by reference numeral 205. A glass wafer or a silicon wafer or wafers 202 made of alternate materials as mentioned above in connection with the first and second preferred processes support a wafer made of the layers 204, 206, 208, 210, 212, and 214 that bear the electronics, ILDs, metal conductors, and photo detectors of the imagers 200 and 201. The layer 204 is a layer of planarized silicon oxide. The layer 206 is formed of multiple layers of deposited oxide/nitride. The layer 208 is formed of deposited silicon oxide. The layer 210 is a layer of P-silicon (or n-type silicon). Layer 212 is made of silicon dioxide. The layer 214 is a layer of P-silicon (or n-type silicon). The implanted wells (of opposing dopings) 216 form the photo-collectors of the CCD or CMOS imager and will serve as the imager pixels. The metal traces 218 are formed in the layer 206 during fabrication and provide die input or output electrical connections to and from devices such as gates, MOSFETs and the like in the imager. The metal traces 218 will be visible from the backside of the imagers 200 and 201 and will serve as first alignment marks or features on the frontside that can be used to orient the formation of the cavity 220 and placement of the back metal pads 236 and 238.

Some exemplary thicknesses of the layers are as follows: layer 206, 2 microns; layer 208, 5 microns; layer 210, 10 microns; layer 212, 0.3 microns; and layer 214, 600 microns. The width of the metal trace 218 may be 80 microns and its thickness may be 0.7 microns. The resistivity of layer 210 may be 20 Ω-cm. It will be understood to those of skill in the art that the specific thicknesses, widths, resistivities, and materials may be varied and this disclosure is not to be considered to be limited to those thicknesses, widths, resistivities, and materials. In addition, the layering may be varied in position and order as will be known to those of skill in the art of designing and fabricating imagers.

It will be noted that at the stage shown in FIG. 25 the glass wafer or substrate 202 is attached, no I-O pads have been attached, and no electrical communication has been established between the metal trace 218 and the backside. The following steps will accomplish these ends. The stage shown in FIG. 25 is the beginning stage for both the third and fourth preferred methods.

Figure 26:
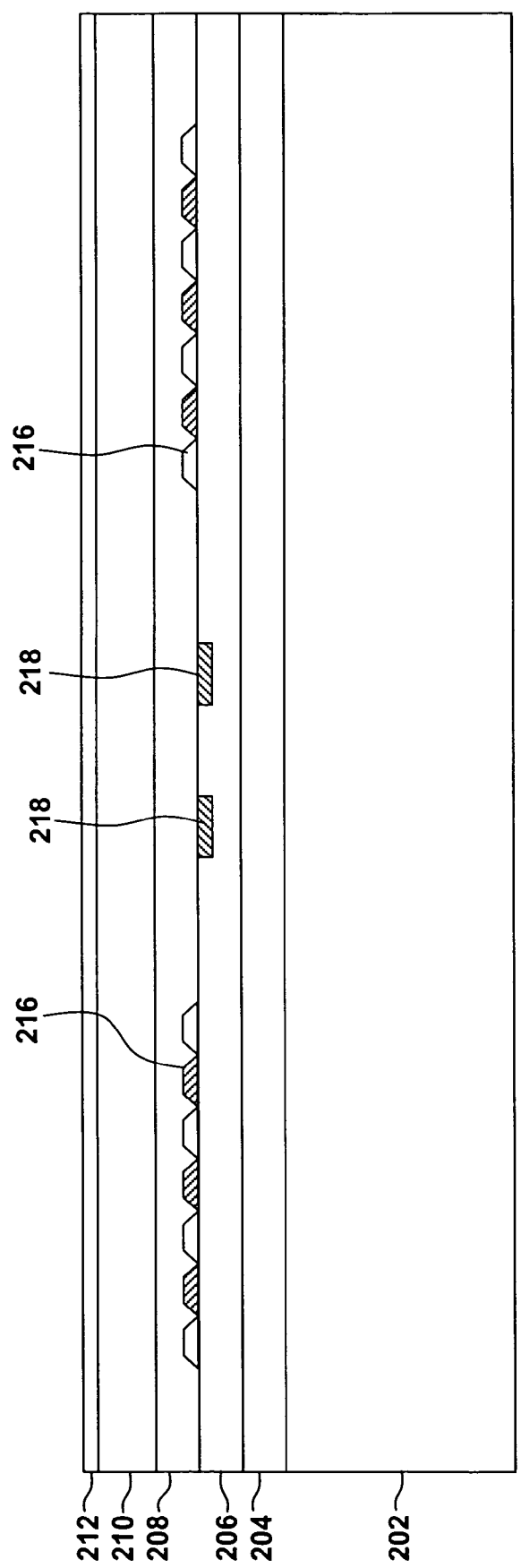

The result of the next step is shown in FIG. 26. In this step the backside of the imager 200 is thinned. Thus, the layer 214 of p-doped silicon is removed by blanket thinning, such as by etching or a like process down to the silicon dioxide of layer 212. The layer 212 serves as an etch stop.

Figure 27:
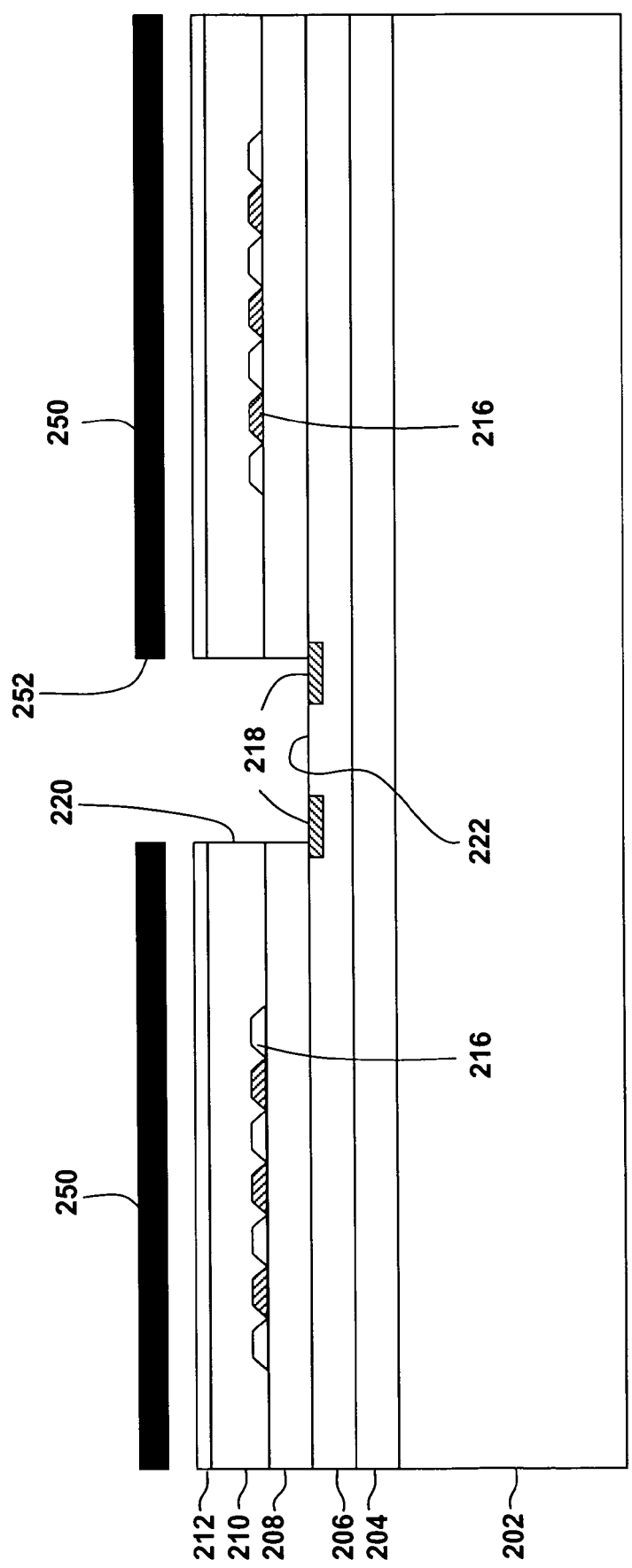

The result of the next step is shown in FIG. 27. This is a step of pad opening. A mask 250 is provided above the silicon dioxide of layer 212. The mask 250 has an opening 252 above the metal traces 218. A cavity 220 is etched, such as by plasma etching or RIE with different ions to successively etch layers of silicon dioxide and silicon, through the layers 212, 210, and 208 down to the deposited oxide/nitride of layer 206. The floor 222 of the cavity 220 is formed by the layer 206. The metal traces 218 are now exposed to the outside by the cavity 220.

It will be understood that the masks shown in connection with the descriptions of the preferred processes of FIGS. 25-39 are notional masks for the purpose of illustration. Persons of skill in the art will understand that masks are employed with photoresists in the process of photolithography and that the photoresists are stabilized or not by exposure or not to light emitted through or blocked by the masks before the unstabilized photoresists are removed prior to a step such as etching. Persons of skill in the art will also understand that the processes described in connection with FIGS. 4-24 may employ photolithography in some of the various steps described in connection with those drawings although masks are not shown.

Figure 28:
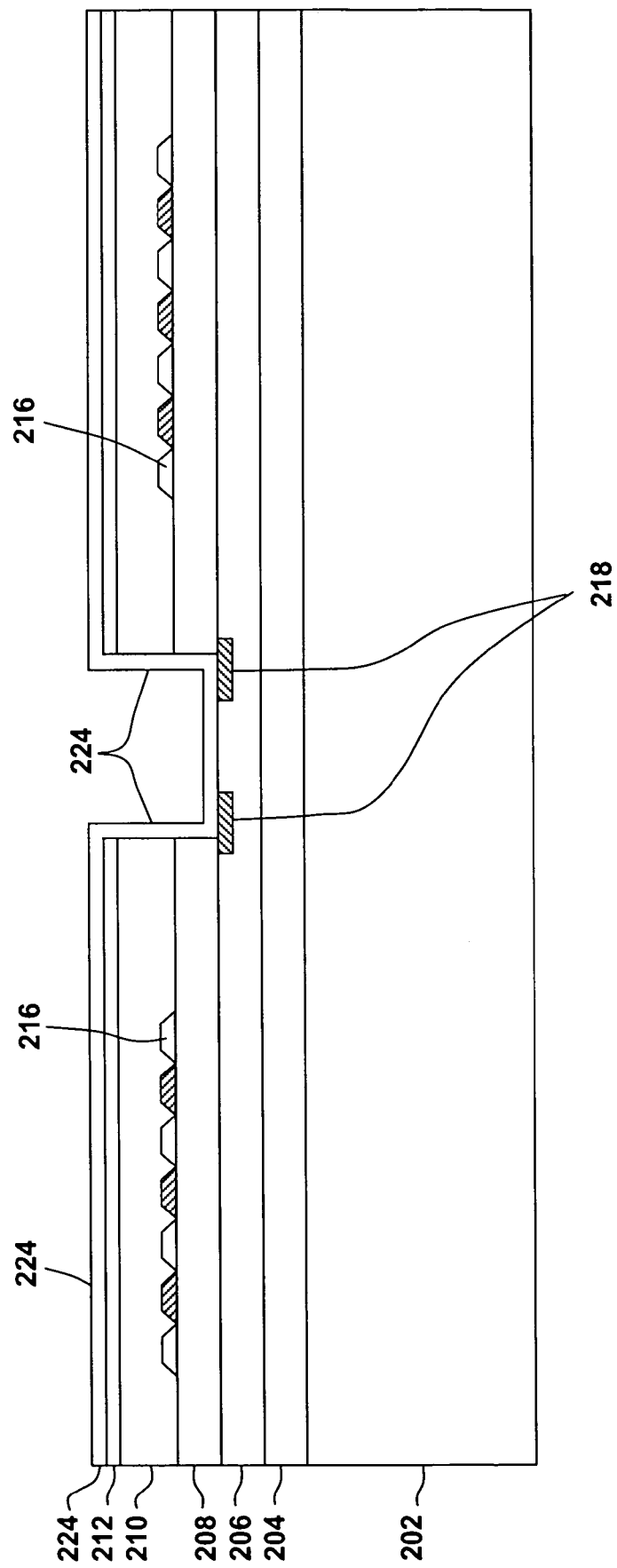

The result of the next step is shown in FIG. 28. This is a step of liner oxide/nitride deposition. A layer or liner 224 of oxide/nitride is deposited on the surface of the layer 212 and the walls and floor of the cavity 220 by means of low-temperature deposition methods such PECVD or TEOS. or TEOS (tetraethoxysilane is a source of silicon during plasma-excited deposition of silicon dioxide). In order to be compatible with the metal layers already present, the temperature of deposition will be kept at 350 C., well below the metal melting point. The oxide/nitride layer presents a barrier to moisture and undesirable mobile ions (such as sodium) and guards against device performance degradation to such contaminants. An exemplary thickness of the liner 224 is 0.4 microns.

Figure 29:
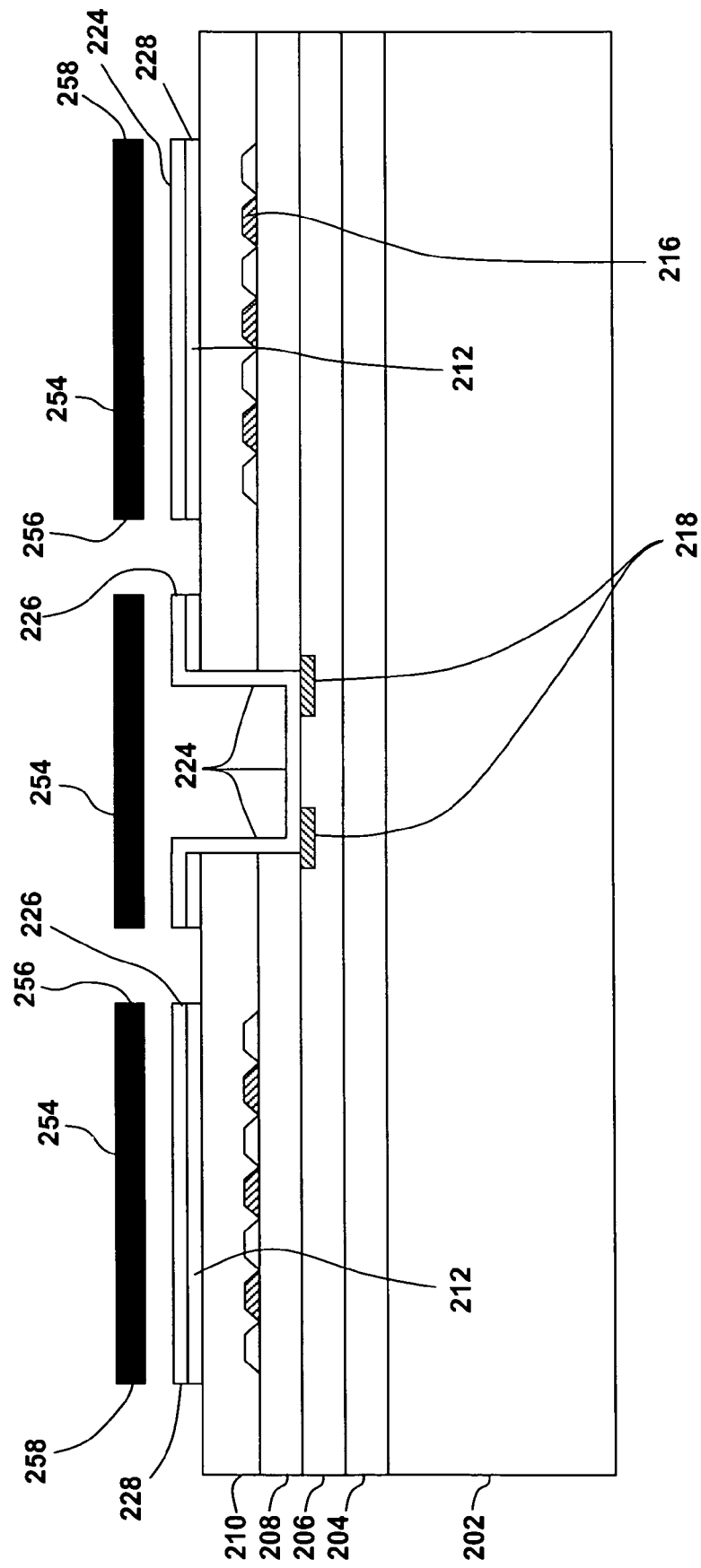

The result of the next step is shown in FIG. 29. This is a step of patterning. Another mask 254 is provided above the layer or liner 224. The mask 244 has openings 256 and 258 that permit RIE etching of the material underneath the openings 256 and 258 to form windows 226 and 228, respectively, in the layers 224 and 212 above the P-silicon of layer 210. The windows 226 and 228 may be least about 100 microns wide, corresponding to support electronics integrated on the imager chip.

Figure 30:
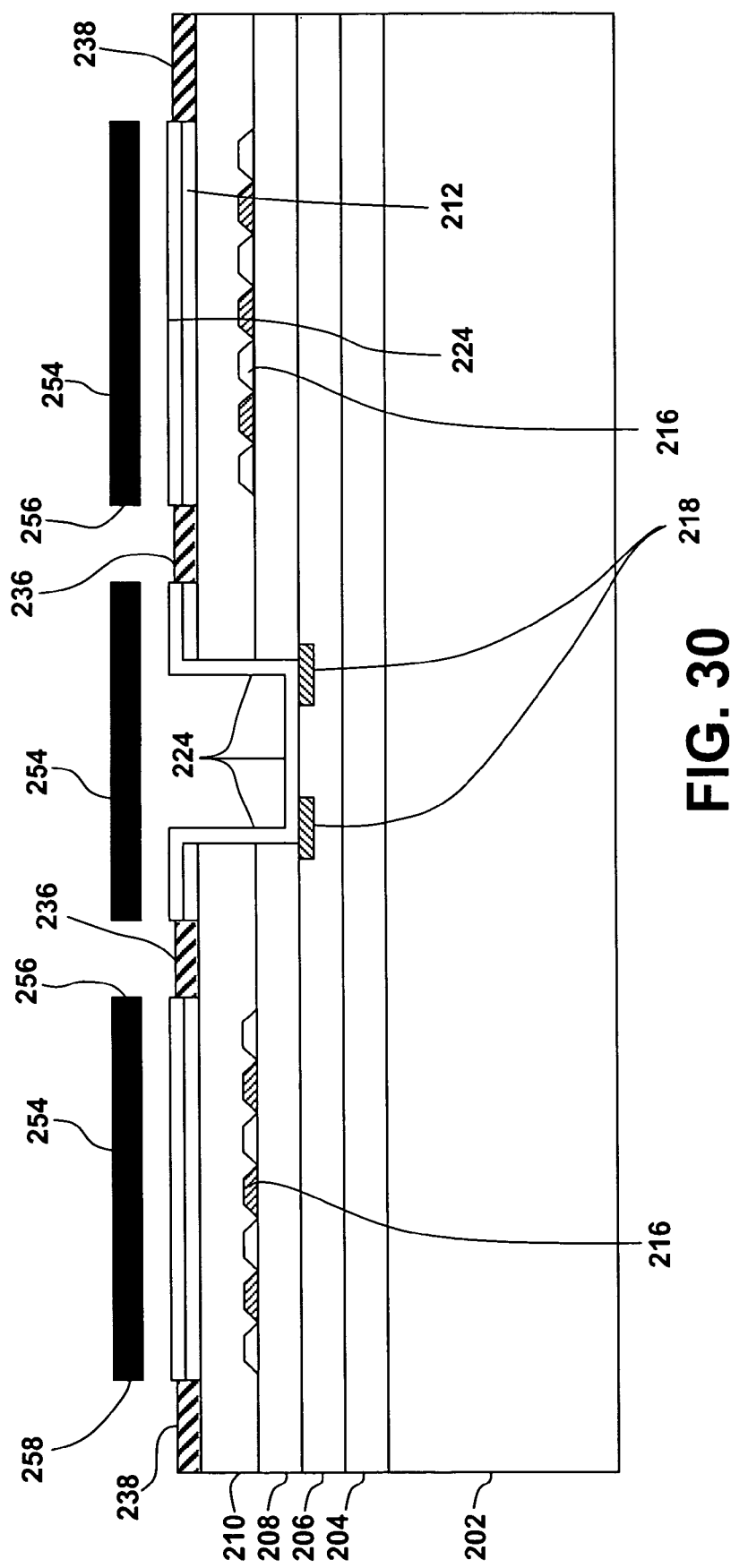

The result of the next step is shown in FIG. 30. This is a step of forming back contacts. Metal is sputtered or evaporated over the oxide/nitride layer, and then patterned using the mask 254, creating metal pads 236 and 238. The metal pads 236 and 238 connect to the backside of the silicon 210 and form the backside silicon contact. The metal is annealed with hydrogen gas. The back metal pads 236 and 238 will serve as alignment marks for the microlens and color filter arrays.

Figure 31:
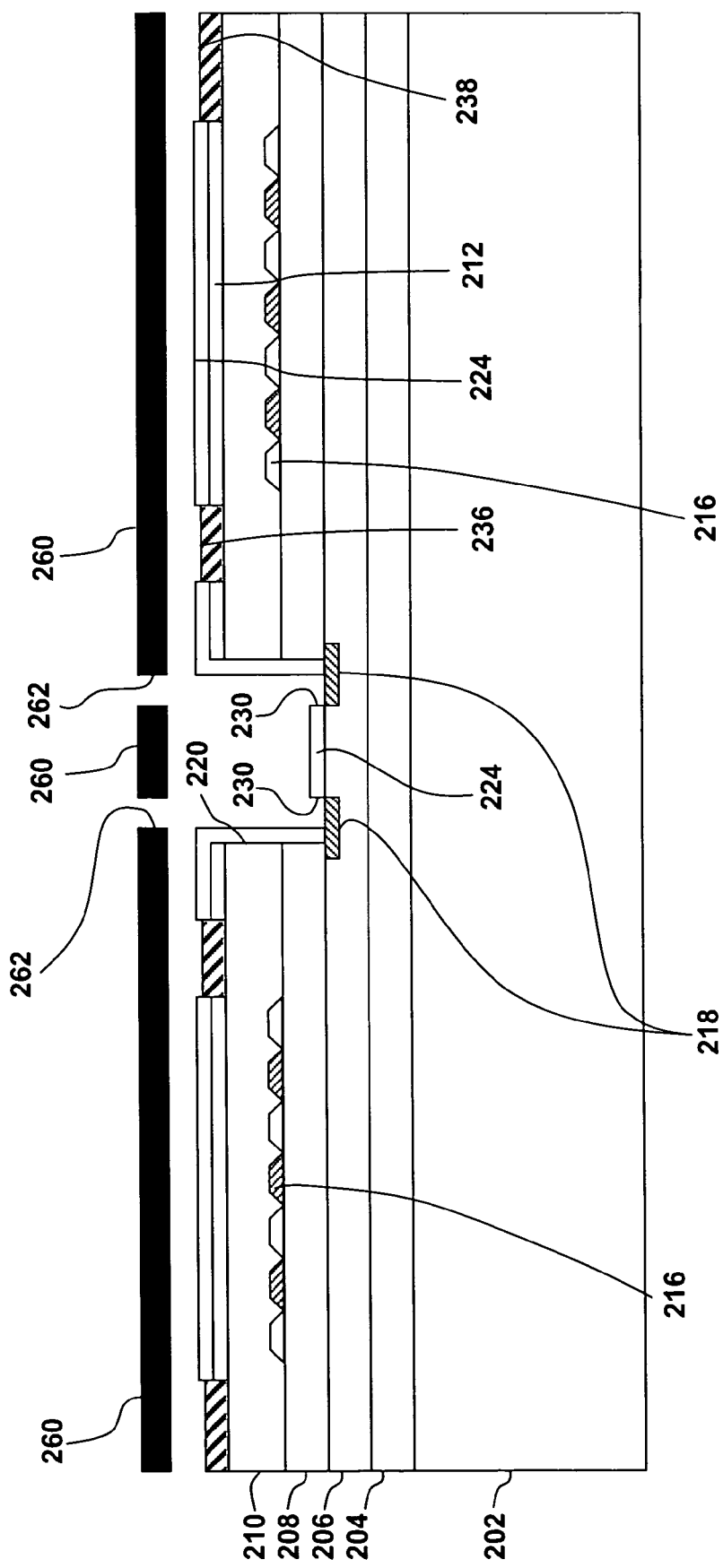

The result of the next step is shown in FIG. 31. This is a step of etching the deposited oxide/nitride to expose the metal traces 218. A mask 260 is placed above the imager, specifically above the passivative layer 224. The mask 260 has openings 262 located above the cavity. The liner layer 224 is etched away by a plasma beam entering through the openings 262 in the mask 260 to create windows 230 above the metal traces 218. The structure is annealed in hydrogen gas at an elevated temperature, such as 400 C. The effect of annealing is to passivate interface traps that may have been present during the device processing or introduced during backside thinning, cavity formation, and subsequent metallization steps, and thereby improve quantum efficiency and dark current performance of the imager.

The result of the next step is shown in FIG. 32. The backside-illuminated imager 200 is shown after the step of dicing at the cavity 220 (between the metal traces 218). The metal trace 218 provides for electrical connection to the back and side of the imager 200. The back metal pads 236 and 238 serve as contacts to the backside of the wafer and second or backside alignment marks for placement of a color filter array and a microlens array in proper orientation above the wells 216 so that the pixels will each have an appropriate filter and microlens above it. It will be understood that other second or backside alignment marks and features, such as cross-hairs, could have been deposited or otherwise provided for this purpose. The imager 200 is provided with a color filter array 262 and a microlens array 264 as discussed above in connection with the methods described in connection with FIGS. 4-24.

Another and fourth preferred method according to the disclosure for making a backside-illuminated imager with standard packaging is shown in FIGS. 33-39.

Figure 33:
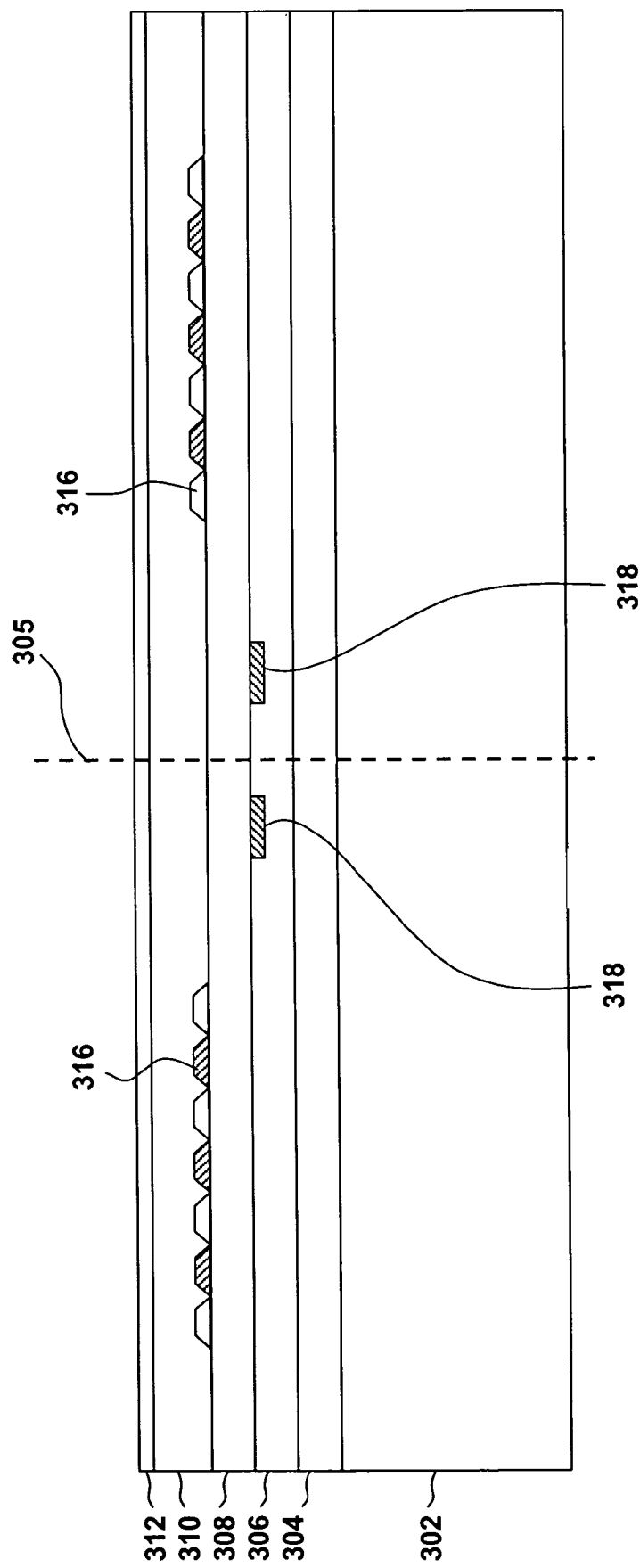
FIGS. 33-39 show schematic cross-sectional views of a backside-illuminated imager at successive steps of its preparation according to a fourth preferred method for preparing backside-illuminated imagers.

FIG. 33 shows two backside-illuminated imagers 300 and 301 prior to dicing at along the dashed line indicated by reference numeral 305. The construction of the imagers is at a stage corresponding to FIG. 26 described above. A glass wafer or a silicon wafer or wafers 232 made of alternate materials as mentioned above in connection with the first and second preferred processes support the layers 304, 306, 308, 310, 312, and 314 that bear the electronics, ILDs, metal conductors, and photo detectors of the imagers 300 and 301. The layer 304 is a layer of planarized oxide. The layer 306 is formed of deposited oxide/nitride. The layer 308 is formed of deposited oxide. The layer 310 is a layer of P-silicon (or n-type silicon). The layer 312 is made of silicon dioxide and is the top backside layer because any higher handle wafer or layer has been removed in an earlier or first step, as in FIG. 26. The implanted wells 316 form the collectors of charge for the photo detector of the imager. The metal traces 318 are formed in the layer 306 during fabrication and provide electrical connections to devices such as gates and the like in the imager. The metal traces 318 will be visible from the backside of the imagers 300 and 301 and will serve as first alignment marks or features on the frontside that can be used to orient the formation of the cavity 320 and placement of the back metal pads 336 and 338.

Figure 34:
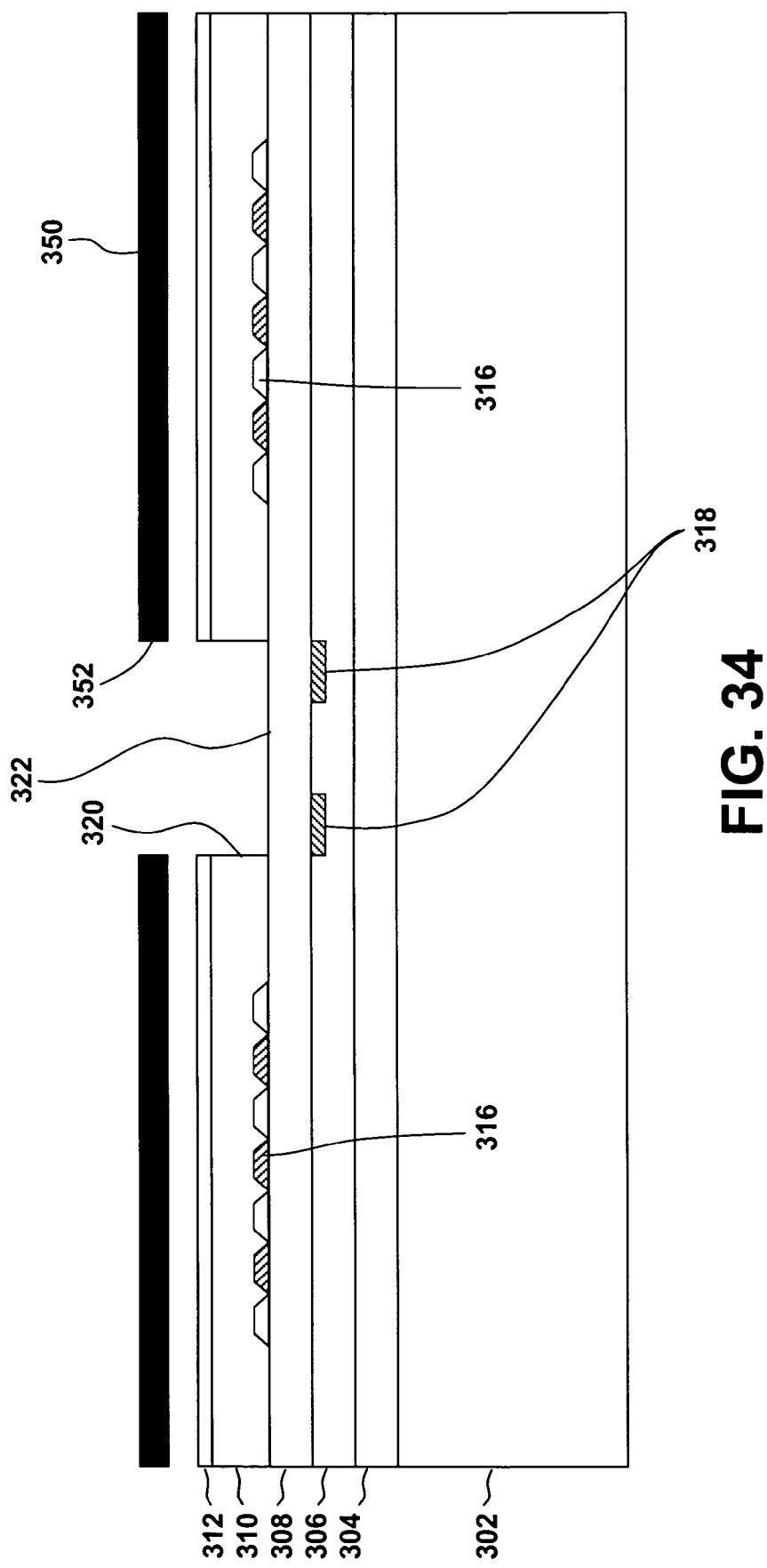

The result of the next step is shown in FIG. 34. This is a step of pad opening. A mask 350 is provided above the silicon dioxide of layer 312. The mask 350 has an opening 352 above the metal traces 318. A cavity 320 with a floor 322 is etched, such as by plasma etching or RIE with different ions to successively etch layers of silicon dioxide and silicon, through the layers 312 and 310 down to the deposited oxide/nitride of the layer 308. The floor 322 is formed by the layer 308. The metal traces 318 are still covered by the layer 308.

Figure 35:
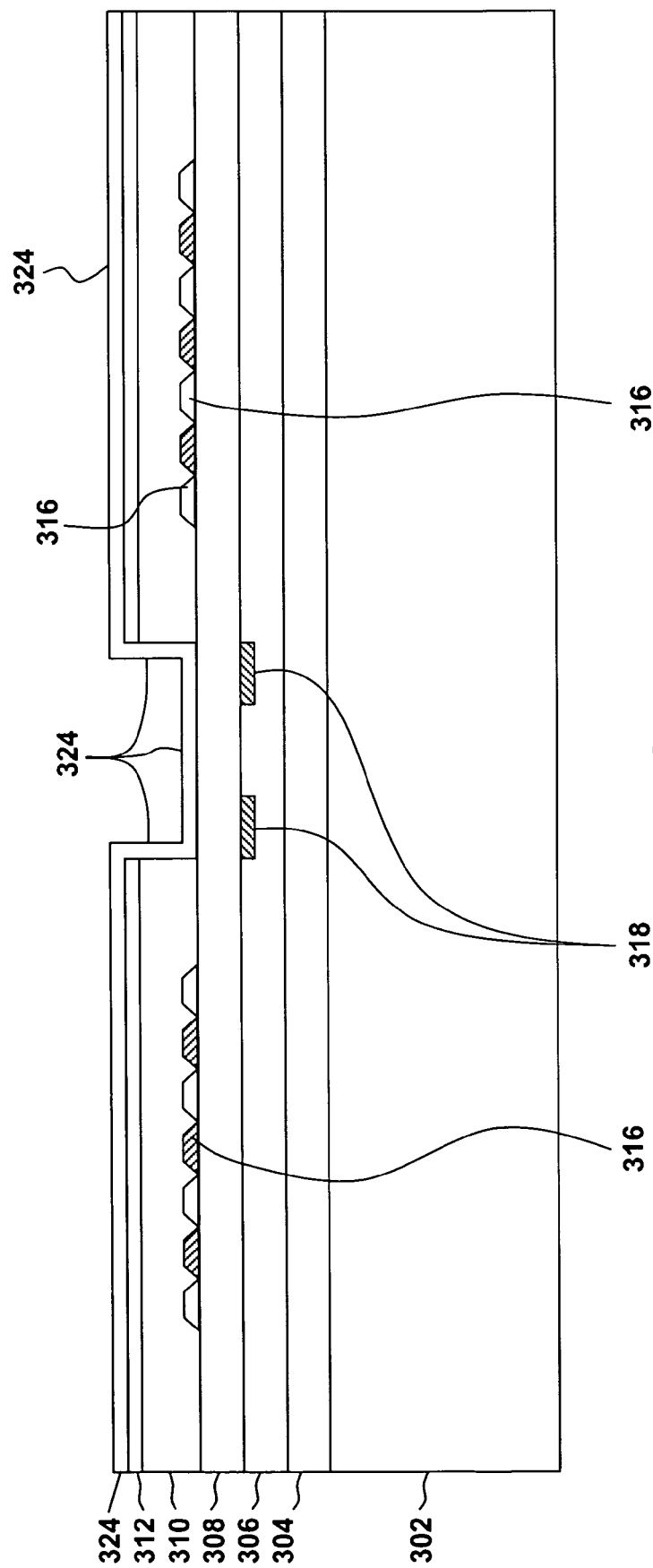

The result of the next step is shown in FIG. 35. This is a step of liner oxide/nitride deposition. A layer or liner 324 of oxide/nitride is deposited on the surface of the layer 312 and the walls and floor 322 of the cavity 320 by means of low-temperature deposition methods such PECVD or TEOS. In order to be compatible with the metal layers already present, the temperature of deposition will be kept at 350 C., well below the metal melting point. The oxide/nitride layer presents a barrier to moisture and undesirable mobile ions (such as sodium) and guards against device performance degradation to such contaminants. An exemplary thickness of the liner 324 is 0.4 microns.

Figure 36:
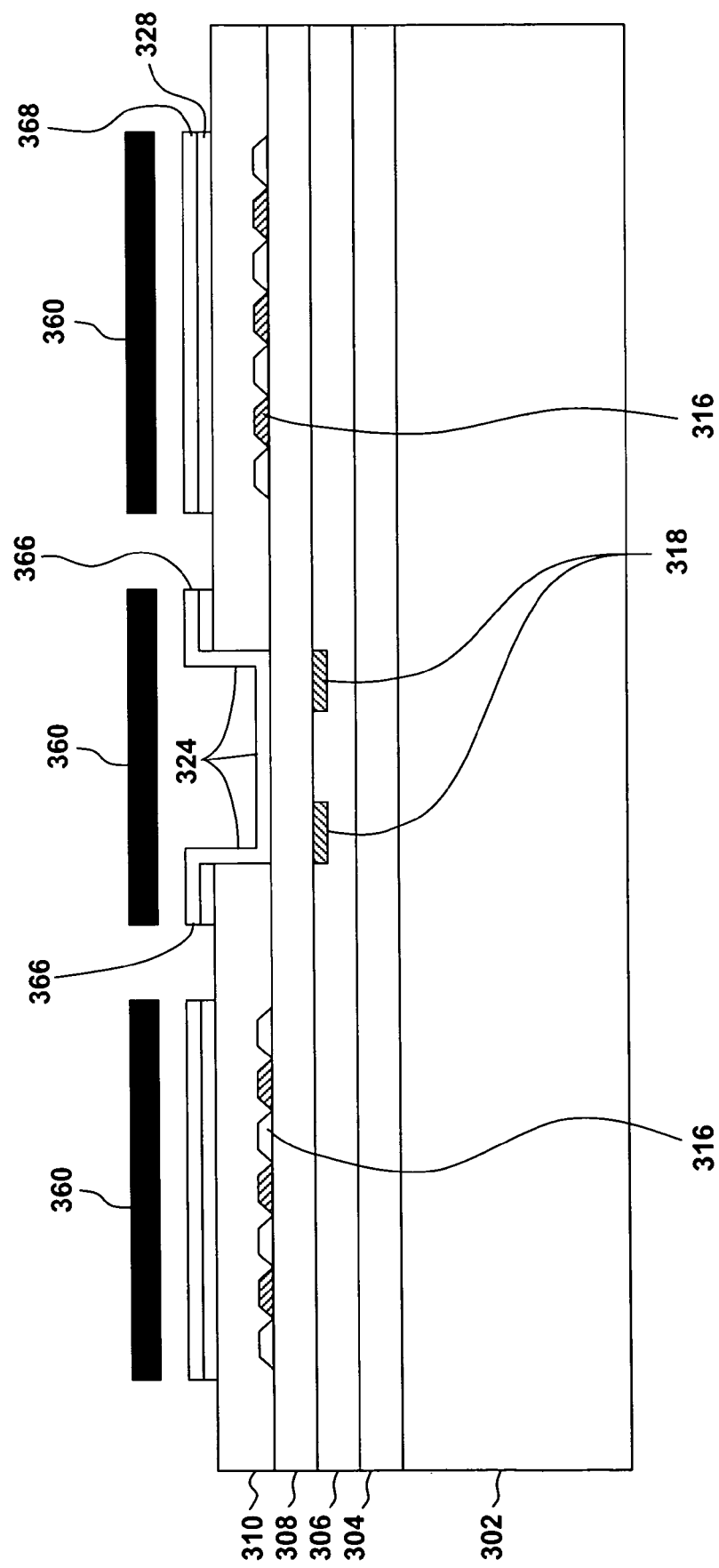

The result of the next step is shown in FIG. 36. This is a step of patterning to create back contacts. Another mask 360 is provided above the layer or liner 324. The mask 360 has openings 366 and 368 that permit RIE etching of the material underneath the openings 366 and 368 to form the windows 326 and 328, respectively, in the layers 324 and 312 above the P-silicon of layer 310. The windows 326 and 328 may be at least about 100 microns wide, corresponding to support electronics integrated on the imager chip.

Figure 37:
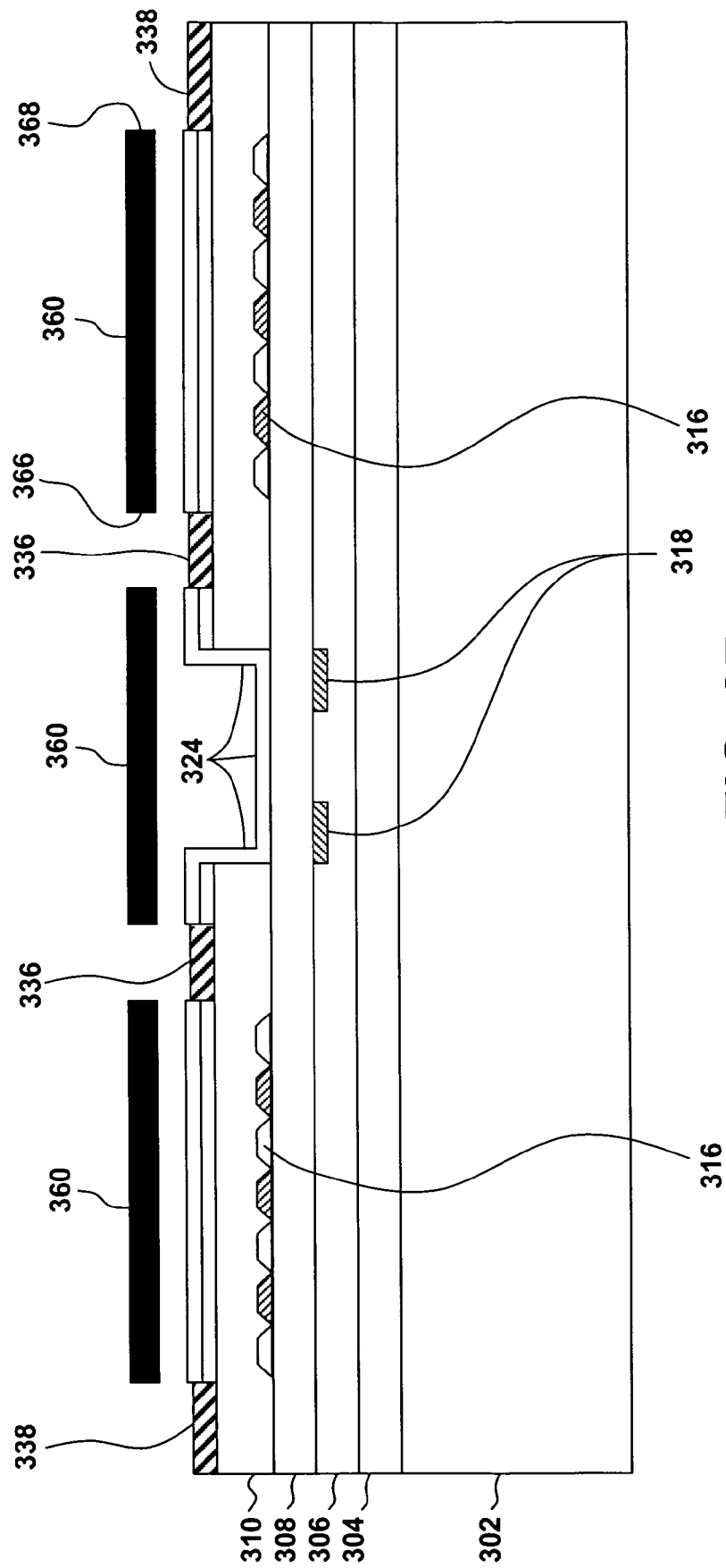

The result of the next step is shown in FIG. 37. This is a step of forming back contacts. Metal is sputtered or evaporated over the oxide/nitride layer, and then patterned through the mask 360, creating metal pads 336 and 338. The metal pads connect to the backside of the silicon 310 and form the backside silicon contact. The metal is annealed with hydrogen gas. The back metal pads 336 and 338 will serve as alignment marks for the microlens and color filter arrays.

Figure 38:
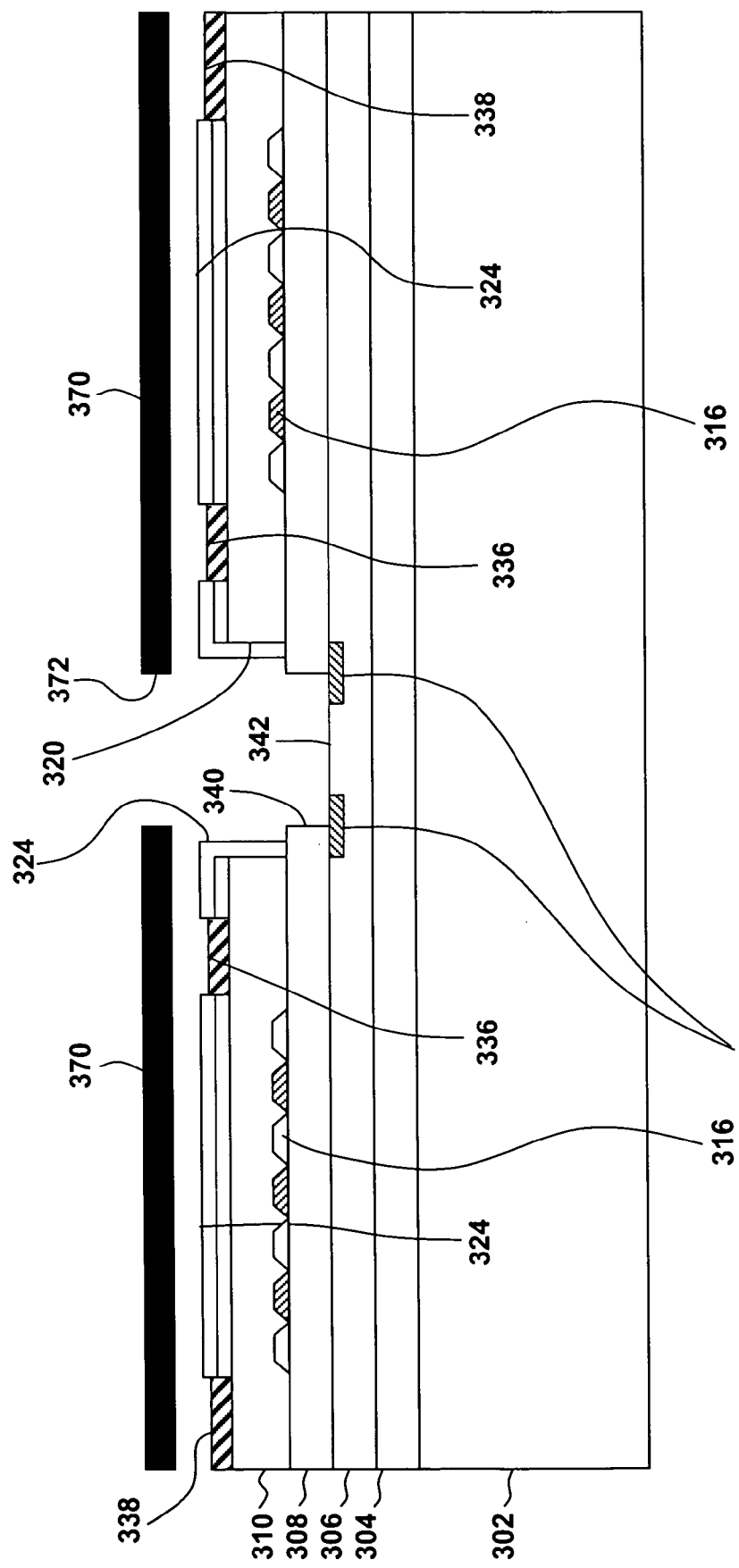

The result of the next step is shown in FIG. 38. This is a step of etching the deposited oxide/nitride to expose the metal traces 318. A mask 370 is placed above the imager, specifically above the passivative layer 324 and the back metal pads 336 and 338. The mask 370 has an opening 372 located above the cavity 320. The liner layer 324 above the floor 322 is etched away by a plasma beam entering through the opening 272 in the mask 270 to create a cavity 340 in the layer 308 above the metal traces 318. The opening 372 in the mask 370, and thus the cavity 340, has a smaller diameter than the cavity 320 although the diameter of the cavity 340 is large enough to expose the metal traces 318. The metal traces 318 are annealed with hydrogen gas at an elevated temperature, such as 400 C. The effect of annealing is to passivate interface traps that may have been present during the device processing or introduced during backside thinning, cavity formation, and subsequent metallization steps, and thereby improve quantum efficiency and dark current performance of the imager.

The result of the next step is shown in FIG. 39. The backside-illuminated imager 300 is shown after the step of dicing at the cavity 320 (between the metal traces 318). The metal trace 318 provides for electrical connection to the back and side of the imager 300. The back metal pads 336 and 338 serve as contacts to the backside of the wafer and as second or backside alignment marks for placement of a color filter array and a microlens array in proper orientation above the wells 316 so that the pixels will each have an appropriate filter and microlens above it. It will be understood that other second or backside alignment marks and features, such as cross-hairs, could have been deposited or otherwise provided for this purpose. The imager 300 is provided with a color filter array 362 and a microlens array 364 as discussed above in connection with the processes described in connection with FIGS. 4-24.

While illustrative embodiments of the imagers and processes disclosed herein have been shown and described in the above description, numerous variations and alternative embodiments will occur to those skilled in the art and it should be understood that, within the scope of the appended claims, the invention may be practiced otherwise than as specifically described. Such variations and alternative embodiments are contemplated, and can be made, without departing from the scope of the invention as defined in the appended claims.

What is claimed is:

1. A method of fabricating a backside-illuminated imaging structure, comprising:
   providing a wafer having a frontside and a backside;
   forming a device layer including one or more imager structures on the frontside of the wafer;
   forming a metal and dielectric stack on the device layer;
   providing electrical access from the backside of the wafer to the metal and dielectric stack;
   providing one or more first alignment marks or features on the frontside of the wafer in respective one or more first positions; and
   providing one or more second alignment marks or features on the backside of the wafer in respective one or more second positions different from the one or more first positions by using the one or more first alignment marks or features as a positioning guide for the second one or more alignment marks or features.

2. The method according to claim 1 further comprising deposition of a passivation layer on at least part of the backside of the wafer.

3. The method according to claim 1 further comprising heating the backside-illuminated imaging structure in an appropriate environment for passivation of interface traps and improving device performance.

4. The method according to claim 1 further comprising supporting the wafer on the frontside with a backing substrate.

5. The method according to claim 4 wherein the backing substrate is attached to the metal and dielectric stack.

6. The method according to claim 1 further comprising providing at least one of a color filter array and a microlens array on the backside of the wafer.

7. The method according to claim 1 further comprising providing at least one of a color filter array and a microlens array on the backside of the wafer and wherein the second alignment marks or features are used to align at least one of a color filter array and a microlens array so that at least one imager structure is optically aligned with at least one of a color filter and a microlens.

8. The method according to claim 1 further comprising one or more pads of conductive material on the backside of the wafer, at least one of the pads being in electrical connection to the backside of the wafer.

9. The method according to claim 8 wherein the one or more second alignment marks or devices comprise the one or more pads of conductive material.

10. The method according to claim 1 wherein the step of providing electrical access from the metal and dielectric stack to the backside of the wafer comprises forming a at least one cavity in the wafer between the metal and dielectric stack and the backside, providing one or more alignment marks in connection with the cavity, electrically isolating the cavity from the wafer, filling the cavity with a conductive material, and adding a conductive pad on the backside of the wafer in electrical communication with the conductive material.

11. The method according to claim 10 wherein more than one cavity is formed in the wafer between the metal and dielectric stack and the backside and each cavity is electrically isolated from each other as well as from the wafer.

12. The method according to claim 10 wherein the step of electrically isolating the cavity from the wafer comprises providing the cavity with a dielectric liner.

13. The method according to claim 10 wherein the cavity is formed by making a larger cavity opening on the frontside of the wafer and lining the larger cavity with a dielectric liner and further comprising providing one or more microcavities projecting from the cavity adjacent the backside of the wafer, wherein the cavity and the one or more projecting microcavities are filled with the conductive material, the filled one or more microcavities form one or more second alignment marks and are visible on the backside of the wafer, wherein the one or more second alignment marks are used to align the conductive pad.

14. The method according to claim 10 further comprising forming a larger cavity opening on the frontside of the wafer and filling the larger cavity with a dielectric and the one or more alignment marks are provided in the metal and dielectric stack, and further comprising forming the cavity in the dielectric from the backside in the dielectric and filling the second cavity with the conductive material.

15. The method according to claim 1 wherein the step of providing electrical access from the metal and dielectric stack to the backside of the wafer comprises forming at least one cavity in the wafer between the metal and dielectric stack and the backside to expose one or more metal traces in the metal and dielectric stack.

16. The method according to claim 15 wherein the cavity is formed in one or more stages.

17. The method according to claim 15 further comprising dicing the wafer at the cavity and expose the one or more metal traces to a side of the wafer formed by the dicing.

18. A method of fabricating a backside-illuminated imaging structure, comprising:
   providing a wafer having a frontside and a backside;
   forming a device layer including one or more imager structures on the frontside of the wafer;
   forming a metal and dielectric stack on the device layer;
   providing electrical access from the backside of the wafer to the metal and dielectric stack; and
   providing one or more first alignment marks or features on the frontside of the wafer,
   wherein providing electrical access from the metal and dielectric stack to the backside of the wafer comprises forming a at least one cavity in the wafer between the metal and dielectric stack and the backside, providing one or more alignment marks in connection with the cavity, electrically isolating the cavity from the wafer, filling the cavity with a conductive material, and adding a conductive pad on the backside of the wafer in electrical communication with the conductive material, and
   wherein the cavity is formed by making a larger cavity opening on the frontside of the wafer and lining the larger cavity with a dielectric liner and further comprising providing one or more microcavities projecting from the cavity adjacent the backside of the wafer, wherein the cavity and the one or more projecting microcavities are filled with the conductive material, the filled one or more microcavities form one or more second alignment marks and are visible on the backside of the wafer, wherein the one or more second alignment marks are used to align the conductive pad.

19. A method of fabricating a backside-illuminated imaging structure, comprising:
   providing a wafer having a frontside and a backside;
   forming a device layer including one or more imager structures on the frontside of the wafer;
   forming a metal and dielectric stack on the device layer;
   providing electrical access from the backside of the wafer to the metal and dielectric stack; and
   providing one or more first alignment marks or features on the frontside of the wafer,
   wherein providing electrical access from the metal and dielectric stack to the backside of the wafer comprises forming a at least one cavity in the wafer between the metal and dielectric stack and the backside, providing one or more alignment marks in connection with the cavity, electrically isolating the cavity from the wafer, filling the cavity with a conductive material, and adding a conductive pad on the backside of the wafer in electrical communication with the conductive material,
   the method further comprising forming a larger cavity opening on the frontside of the wafer and filling the larger cavity with a dielectric and the one or more alignment marks are provided in the metal and dielectric stack, and further comprising forming the cavity in the dielectric from the backside in the dielectric and filling the second cavity with the conductive material.

* * * * *